(12) United States Patent
Chang

(10) Patent No.: US 10,840,401 B2
(45) Date of Patent: Nov. 17, 2020

(54) METHOD AND DEVICE FOR IMPROVING POWER GENERATION EFFICIENCY OF A SOLAR CELL

(71) Applicant: Chung-Cheng Chang, Keelung (TW)

(72) Inventor: Chung-Cheng Chang, Keelung (TW)

( * ) Notice: Subject to any disclaimer, the term of this patent is extended or adjusted under 35 U.S.C. 154(b) by 349 days.

(21) Appl. No.: 14/720,345

(22) Filed: May 22, 2015

(65) Prior Publication Data

US 2016/0056320 A1    Feb. 25, 2016

(30) Foreign Application Priority Data

Aug. 25, 2014  (TW) .............................. 103129183 A

(51) Int. Cl.
| | | |
|---|---|---|
| *H01L 31/054* | (2014.01) | |
| *H02S 40/42* | (2014.01) | |
| *H01L 31/052* | (2014.01) | |
| *F24S 60/30* | (2018.01) | |
| *F24S 90/10* | (2018.01) | |
| *H02S 40/22* | (2014.01) | |
| *G06F 3/03* | (2006.01) | |
| *H04M 1/725* | (2006.01) | |

(52) U.S. Cl.
CPC .......... *H01L 31/0543* (2014.12); *F24S 60/30* (2018.05); *F24S 90/10* (2018.05); *G06F 3/0308* (2013.01); *H01L 31/0521* (2013.01); *H02S 40/22* (2014.12); *H02S 40/42* (2014.12); *H04M 1/72533* (2013.01); *Y02E 10/40* (2013.01); *Y02E 10/52* (2013.01)

(58) Field of Classification Search
CPC ....... H01L 31/00; H01L 31/02; H01L 31/024; H01L 31/04; H01L 31/048; H01L 31/0475; H01L 31/052; H01L 31/0521
See application file for complete search history.

(56) References Cited

U.S. PATENT DOCUMENTS

| | | | | | |
|---|---|---|---|---|---|
| 4,052,228 A | * | 10/1977 | Russell | ...................... | F24J 2/06 |
| | | | | | 136/246 |
| 4,191,594 A | * | 3/1980 | Stark | .................... | B01D 5/0066 |
| | | | | | 136/246 |
| 6,080,927 A | * | 6/2000 | Johnson | .................. | F24S 20/20 |
| | | | | | 136/248 |

(Continued)

OTHER PUBLICATIONS

Data Sheet of Toluene from Shell Chemicals, retrieved from https://www.shell.com/ on Jun. 5, 2018.*

(Continued)

*Primary Examiner* — Christina Chern
(74) *Attorney, Agent, or Firm* — Muncy, Geissler, Olds & Lowe, P.C.

(57) ABSTRACT

The present invention provides a method for improving power generation efficiency of a solar cell, comprising: providing a synergistic structure for allowing the solar cell to receive light through thereof, wherein the synergistic structure is a three-dimensional structure; the three-dimensional structure has a surface area that is larger than a surface area of the solar cell, a refractive index of substances that used to construct the three-dimensional structure is higher than a refractive index of environmental substances around the solar cell, and improving an interface condition of the solar cell could increase light introduced into the solar cell and improving power generation efficiency of the solar cell.

4 Claims, 34 Drawing Sheets

(56) References Cited

U.S. PATENT DOCUMENTS

| | | | | |
|---|---|---|---|---|
| 6,323,415 | B1* | 11/2001 | Uematsu | B32B 17/10018 |
| | | | | 136/246 |
| 6,337,436 | B1* | 1/2002 | Ganz | H02S 40/34 |
| | | | | 136/244 |
| 2003/0005957 | A1* | 1/2003 | Tanaka | H01L 31/048 |
| | | | | 136/263 |
| 2010/0170561 | A1* | 7/2010 | Peng | H01L 31/0521 |
| | | | | 136/246 |
| 2014/0090687 | A1* | 4/2014 | Den Boer | H02S 20/26 |
| | | | | 136/246 |
| 2016/0204296 | A1* | 7/2016 | Zhu | H01L 31/0521 |
| | | | | 136/246 |

OTHER PUBLICATIONS

"Carrying Charges" retrieved from http://www.sciencenter.org/chemistry/d/carryingcharges.pdf on May 9, 2019.*

Refractive index of water retrieved from https://refractiveindex.info/?shelf=3d&book=liquids&page=water on May 9, 2019.*

Refractive index for some common liquids, solids and gases retrieved from https://www.engineeringtoolbox.com/refractive-index-d_1264.html on Nov. 5, 2019.*

Refractive index of Xenon retrieved from https://refractiveindex.info/?shelf=main&book=Xe&page=Bideau-Mehu on Feb. 24, 2020.*

Refractive index of air retrieved from https://refractiveindex.info/?shelf=other&book=air&page=Ciddor on Feb. 24, 2020.*

* cited by examiner

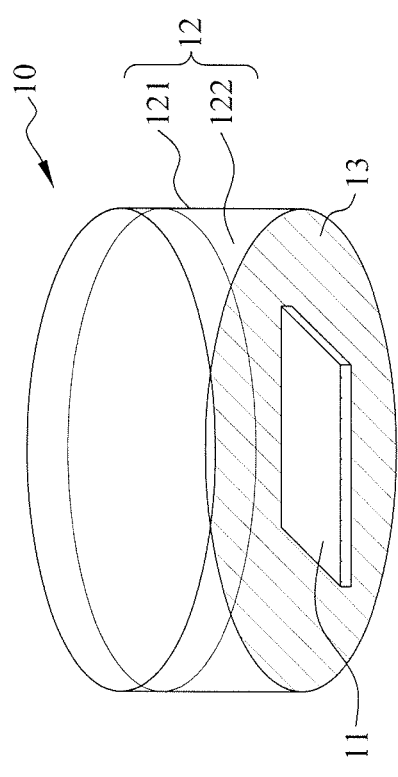
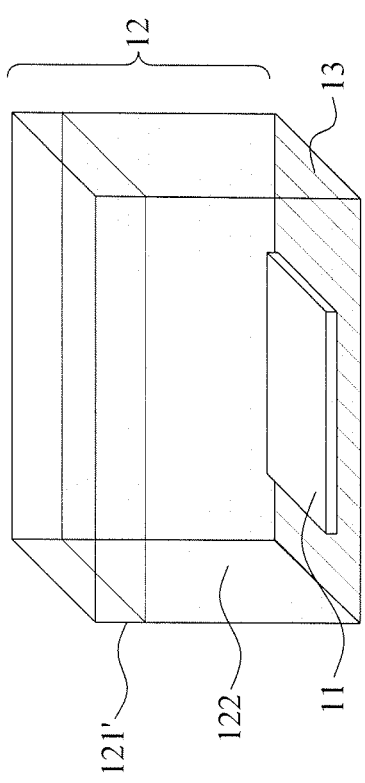
FIG. 1A
FIG. 1B

METHOD AND DEVICE FOR IMPROVING POWER GENERATION EFFICIENCY OF A SOLAR CELL

CROSS-REFERENCE TO RELATED APPLICATIONS

This application claims the priority benefit of Taiwan application No. 103129183, filed on Aug. 25, 2014. The disclosure of the Taiwan application is incorporated by reference herein.

BACKGROUND OF THE INVENTION

1. Field of the Invention

The present invention relates to a solar cell, especially relates to a method and device for improving power generation efficiency of a solar cell.

2. The Prior Arts

The United Kingdom reported in 1997 that according to the current petroleum using rate, petroleum may be depleted in use after about forty years. In recent years, the excessive use of petroleum resulting in carbon dioxide emission and greenhouse effect increased, and gets world's attention. The petroleum price rose to $70 per barrel in late August 2005, and hit a new high price of $75 per barrel in April 2006. Under the trend of global petroleum resource gradual reduction and petroleum price rose, the conventional oil, coal and other thermal power generation methods will be limited by the petroleum yield in the future, and environmental pollution and greenhouse effect are also important global issues. Thus, in order to reduce environmental pollution and the greenhouse effect produced by conventional power generation, various countries has been actively developing renewable energy source to replace fossil fuels power generation in recent decays.

The potent renewable energy source is fuel cells, wind power generation and solar cells, and wind power generation and solar cells have been commercialized. Wind power generation must be set at the appropriate environment; while the environment which the solar cell set is less affected. Solar power generation is a renewable and eco-friendly power generation way and no contribution to environment pollution because no carbon dioxide or other greenhouse gas to be emitted during the power generation process. Solar cell power generation has advantage in free, unlimited energy supply, low ecological environment impact, constant conversion efficiency, life of up to 20 years and could use light source other than sun light to generate power, thus application and research of solar cells is currently one of the important directions in the development of renewable energy field.

From the 1950s, integration of the solar energy industry has been gradually forming, the United States, Japan, Germany and other advanced countries promote the national photovoltaic development program and the solar roofs program, the photovoltaic industry keep more than 30% annual growth rate in recent years, which is higher than information technology (IT) industry. However, the conventional silicon based solar cell's conversion efficiency of sunlight into electricity is only about 15% on average currently, which is much lower than nuclear power generation (36%) and coal-fired power generation (45%). Therefore, a problem which global people desirous to be solve is how to improve power generation efficiency of solar cells, thereby improving the usability of solar cells which is eco-friendly and have advantage in long life time, and hope the nuclear power generation which is non eco-friendly and have potential safe misgiving could be replaced by the solar power generation.

SUMMARY OF THE INVENTION

To solve the problem, the present invention provides a method for improving power generation efficiency of a solar cell, which is any solar cell, the method providing a synergistic structure for allowing the solar cell to receive light through thereof, wherein the synergistic structure is a three-dimensional structure. The technique to improve power generation efficiency of a solar cell is the use of a principle of the surface area of the three-dimensional structure is larger than the surface area of the solar cell plate, thereby increasing light introduced into the solar cell and improving power generation efficiency of the solar cell. The three-dimensional structure could be a structure formed by solid, liquid, gas or combination thereof, or could be formed by a combination of different substances. The structure formed by liquid, solid or combination thereof is easy to construct. It is preferred that choose high transmittance solid and high transmittance liquid to be the solid and liquid that use to form the three-dimensional structure. Further, using transparent substance to construct the three-dimensional structure is more preferred. The three-dimensional structure construct on a solar cell to improve power generation efficiency of the solar cell. In addition, the amount of light absorbed by three-dimensional structure affects the amount of light introduced in the solar cell. We need to overcome the amount of light absorbed by three-dimensional structure to increase the amount of light introduced in the solar cell and improve the power generation efficiency. In this case, constructing the synergistic structure on the solar cell could increase the net amount of light received by the solar cell, that is, the increased amount of light greater than absorbed amount of light could increase the power generation efficiency of the solar cell. Thus, it is preferred that the substances which are used to construct three-dimensional structure have higher transmittance. Further, using transparent substance to construct the three-dimensional structure is more preferred. Increasing the front area and side area of the three-dimensional structure could increase the amount of introduced light and improve the power generation efficiency of the solar cell. Another technique of three-dimensional structure to improve the power generation efficiency of the solar cell is constructing the three-dimensional structure by high refractive index substances, renders the mean refractive index of the constructing substances is higher than the mean refractive index of environmental substance(s) around the solar cell (e.g. air) and the amount of introduced light per unit area thus increased, therefore improving the power generation efficiency of the solar cell. While the mean refractive index of the synergistic structure (i.e. the three-dimensional structure) is higher than the mean refractive index of environmental substance(s) around the solar cell, the numerical aperture of the solar cell became larger and the equivalent acceptance angle of the solar cell became larger, the Airy pattern is more centralized, thus increasing the amount of introduced light and improving the power generation efficiency of the solar cell. Among the substances that used to construct the three-dimensional structure, substances which have higher refractive index have better ability of improving power generation efficiency. It is effective when the mean refractive index of substances that used to construct the three-dimensional structure is higher than the mean refractive index of environmental substance(s) around the solar cell (generally is air). Another technique of three-dimensional structure to improve the power generation efficiency of the solar cell is using glass, polymer, water (including seawater and freshwater), aqueous solution, organic compound or combination thereof to construct the three-dimensional structure. By constructing the synergistic structure on the surface of the solar cell or immersing the solar cell in the liquid of the synergistic structure, we could reducing the temperature of the solar cell by thermal conduction, thermal radiation, thermal convection, flow (e.g. heat convection) or phase change (e.g. evaporation) caused by the substance (in particular liquids, e.g. water, aqueous solution and organic compounds) of synergistic structure to reduce the surface temperature of the solar cell and increase power generation efficiency of the solar cell. The liquid of synergistic structure (or three-dimensional structure) includes water (including seawater and freshwater), aqueous solution, organic compounds (e.g. alcohol and acetone) or combination thereof. The liquid of synergistic structure is effective to reduce the surface temperature of the solar cell and improve the power generation efficiency. Conventional solar cell plate used to construct dissipating device at its back side or around to dissipating heat. One feature of the present invention uses the front side of the solar cell or immersing the solar cell in liquid to dissipating heat. While the increased amount of power generation efficiency generated by dissipating heat is greater than decreased amount of power generation efficiency generated by absorbing light in the synergistic structure, producing the effect of increased power generation efficiency. Further, we could use the constructing substance of synergistic structure to improve power generation efficiency, the constructing substance includes water (including seawater and freshwater), aqueous solution, organic compounds (including hydrocarbons and carbohydrates) or combination thereof. By the contacting of the liquid and the solar cell, covering uniformly on the surface of the solar cell by the liquid (because of the connected pipes principle), diluting the unfavorable light-receiving impurities adsorbed on the surface of the solar cell, and employing the substances which its mean refractive index higher than the mean refractive index of environmental substance(s) around the solar cell (e.g. air), we could improving interface condition of the solar cell and increasing light introduced into solar cell and improving the power generation efficiency.

In the method describe above, the liquid is high transmittance liquid, including, but not limited to water (including seawater and fresh water), aqueous solution, organic compounds (including hydrocarbons and carbohydrates) or combination thereof. The solid described above is high transmittance solid, including, but not limited to quartz, glass, polymer (e.g. plastics) or combination thereof. According to the method for improving power generation efficiency of a solar cell of the present invention, another aspect of the present invention is to provide a method for improving power generation efficiency of a solar cell, comprising: providing at least a solar cell and at least a synergistic structure, the synergistic structure configured on the solar cell for allowing the solar cell receive light through the synergistic structure; wherein the synergistic structure is a three-dimensional structure. The surface area of the three-dimensional structure is larger than the surface area of the solar cell, thereby increasing light introduced into the solar cell and improving power generation efficiency of the solar cell. The technique to improve power generation efficiency of a solar cell is the use of a principle of the surface area of the three-dimensional structure is larger than the surface area of the solar cell plate, thereby increasing light introduced into the solar cell and improving power generation efficiency of the solar cell. The three-dimensional structure could be a structure formed by solid, liquid, gas or combination thereof, or could be formed by a combination of different substances. The structure formed by liquid, solid or combination thereof is easy to construct. It is preferred that choosing high transmittance solid, high transmittance liquid and combination thereof to be the solid, liquid and combination thereof that use to form the three-dimensional structure. Further, using transparent substance to construct the three-dimensional structure is more preferred. The three-dimensional structure construct on a solar cell to improve power generation efficiency of the solar cell. In addition, the amount of light absorbed by three-dimensional structure affects the amount of light introduced in the solar cell. We need to overcome the amount of light absorbed by three-dimensional structure to increase the amount of light introduced in the solar cell and improve the power generation efficiency. In this case, constructing the synergistic structure on the solar cell could increase the net amount of light received by the solar cell, that is, the increased amount of light greater than absorbed amount of light could increase the power generation efficiency of the solar cell. Thus, it is preferred that the substances, which are used to construct three-dimensional structure, have higher transmittance. Further, using transparent substance to construct the three-dimensional structure is more preferred. Increasing the front area and side area of the three-dimensional structure could increase the amount of introduced light and improve the power generation efficiency of the solar cell. Another technique of three-dimensional structure to improve the power generation efficiency of the solar cell is constructing the three-dimensional structure by high refractive index substances, renders the mean refractive index of the constructing substances is higher than the mean refractive index of environmental substance(s) around the solar cell (e.g. air) and the amount of introduced light per unit area thus increased, therefore improving the power generation efficiency of the solar cell. While the mean refractive index of the synergistic structure (i.e. the three-dimensional structure) is higher than the mean refractive index of environmental substance(s) around the solar cell, the numerical aperture of the solar cell became larger and the equivalent acceptance angle of the solar cell became larger, the Airy pattern is more centralized, thus increasing the amount of introduced light and improving the power generation efficiency of the solar cell. Among the substances that used to construct the three-dimensional structure, substances which have higher refractive index have better ability of improving power generation efficiency. It is effective when the mean refractive index of substances that used to construct the three-dimensional structure is higher than the mean refractive index of environmental substance(s) around the solar cell (generally is air). Another technique of three-dimensional structure to improve the power generation efficiency of the solar cell is using glass, polymer, water (including seawater and freshwater), aqueous solution, organic compound or combination thereof to construct the three-dimensional structure. By constructing the synergistic structure on the surface of the solar cell or immersing the solar cell in the liquid of the synergistic structure, we could reducing the temperature of the solar cell by thermal conduction, thermal radiation, thermal convection, flow (e.g. heat convection) or phase change (e.g. evaporation) caused by the substance (in particular liquids, e.g. water, aqueous solution and organic compounds) of synergistic structure to reduce the surface temperature of the solar cell and increase power generation efficiency of the solar cell. Conventional solar cell plate used to construct dissipating device at its back side or around to dissipating heat. One feature of the present invention uses the front side of the solar cell or immersing the solar cell in liquid to dissipating heat. While the increased amount of power generation efficiency generated by dissipating heat is greater than decreased amount of power generation efficiency generated by absorbing light in the synergistic structure, producing the effect of increased power generation efficiency. Further, we could use the constructing substance of synergistic structure to improve power generation efficiency, the constructing substance includes water (including seawater and freshwater), aqueous solution, organic compounds (including hydrocarbons and carbohydrates) or combination thereof. By the contacting of the liquid and the solar cell, covering uniformly on the surface of the solar cell by the liquid (because of the connected pipes principle), diluting the unfavorable light-receiving impurities adsorbed on the surface of the solar cell, and employing the substances which its mean refractive index higher than the mean refractive index of environmental substance(s) around the solar cell (e.g. air), we could improving interface condition of the solar cell and increasing light introduced into solar cell and improving the power generation efficiency.

The device described above could optionally add a supporting device to support and fix the synergistic structure on the upper surface of the solar cell. Optionally, the supporting device supports the synergistic structure and the solar cell at the same time.

In one embodiment of the present invention, the device further comprises a dissipating device and a dissipating device and a cycling device to reduce the temperature of the solar cell and improve its power generation efficiency.

In one embodiment of the present invention, the device comprises a plurality of solar cells and could form a solar cell array, thus improves the power generation amount.

In another embodiment of the present invention, the device comprises a plurality of synergistic structure; each solar cell constructs a corresponding synergistic structure.

By the features of the present invention, it could be applied to conventional solar cell to improve its power generation efficiency.

The preferred embodiments described below are disclosed for illustrative purpose but to limit the modifications and variations of the present invention. Thus, any modifications and variations made without departing from the spirit and scope of the invention should still be covered by the scope of this invention as disclosed in the accompanying claims.

BRIEF DESCRIPTION OF THE DRAWINGS

FIGS. 1A and 1B show a schema of the device for improving power generation efficiency of a solar cell of the present invention, wherein the synergistic structure is a high transmittance solid having (A) hollow cylinder shape or (B) hollow tetragonal prism (or hollow rectangular prism) shape.

DETAILED DESCRIPTION OF THE PREFERRED EMBODIMENTS

Figure 2:
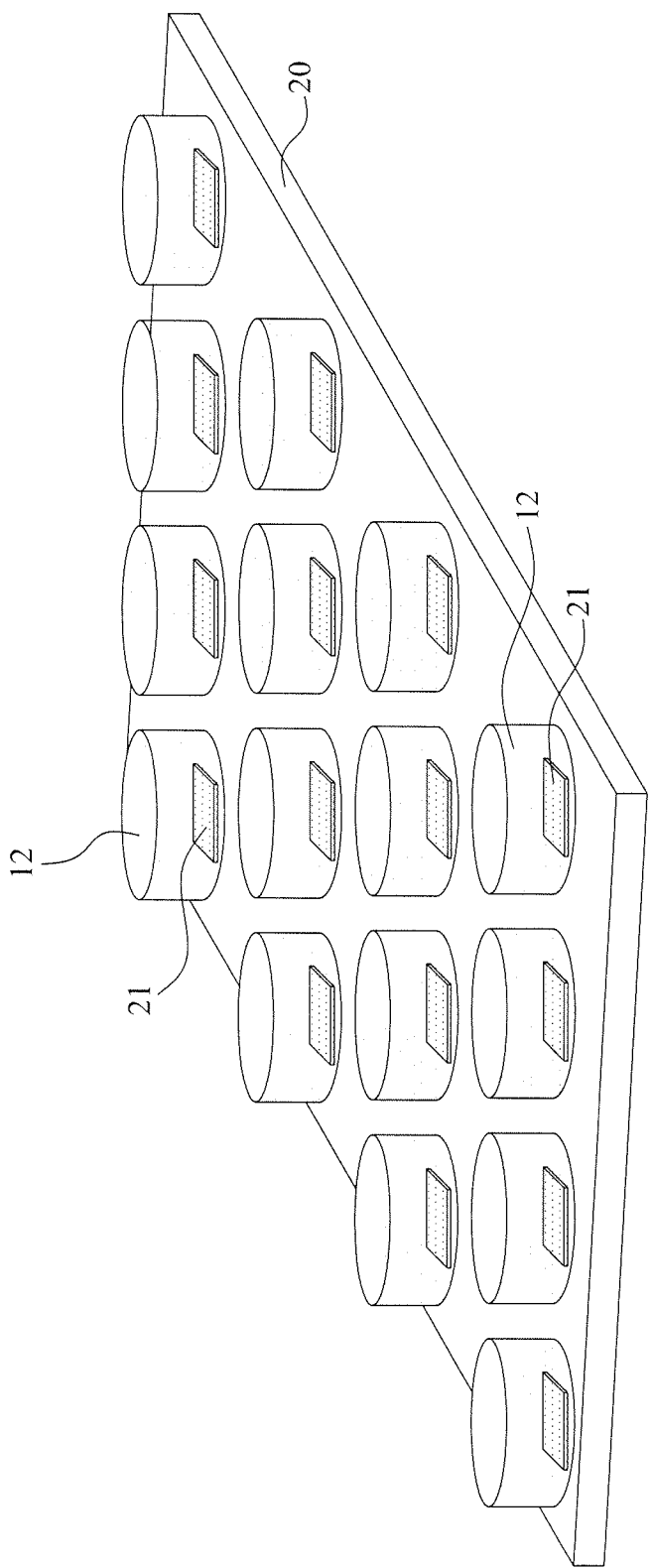
FIG. 2 shows a schema of the device for improving power generation efficiency of a solar cell of the present invention apply to a solar cell array plate.

A aspect of the present invention is to provide a method for improving power generation efficiency of a solar cell, providing a synergistic structure for allowing the solar cell receive light through thereof, wherein the synergistic structure is a three-dimensional structure. The technique to improve power generation efficiency of a solar cell is the use of a principle of the surface area of the three-dimensional structure is larger than the surface area of the solar cell plate, thereby increasing light introduced into the solar cell and improving power generation efficiency of the solar cell. The three-dimensional structure could be a structure formed by solid, liquid, gas or combination thereof, or could be formed by a combination of different substances. The structure formed by liquid, solid or combination thereof is easy to construct. It is preferred that choose high transmittance solid and high transmittance liquid to be the solid and liquid that use to form the three-dimensional structure. The three-dimensional structure construct on a solar cell to improve power generation efficiency of the solar cell. In addition, the amount of light absorbed by three-dimensional structure affects the amount of light introduced in the solar cell. We need to overcome the amount of light absorbed by three-dimensional structure to increase the amount of light introduced in the solar cell and improve the power generation efficiency. In this case, constructing the synergistic structure on the solar cell could increase the net amount of light received by the solar cell, that is, the increased amount of light greater than absorbed amount of light could increase the power generation efficiency of the solar cell. Thus, it is preferred that the substances which are used to construct three-dimensional structure have higher transmittance. Further, using transparent substance to construct the three-dimensional structure is more preferred. Increasing the front area and side area of the three-dimensional structure could increase the amount of introduced light and improve the power generation efficiency of the solar cell. Another technique of three-dimensional structure to improve the power generation efficiency of the solar cell is constructing the three-dimensional structure by high refractive index substances, renders the mean refractive index of the constructing substances is higher than the mean refractive index of environmental substance(s) around the solar cell (e.g. air) and the amount of introduced light per unit area thus increased, therefore improving the power generation efficiency of the solar cell. While the mean refractive index of the synergistic structure (i.e. the three-dimensional structure) is higher than the mean refractive index of environmental substance(s) around the solar cell, the numerical aperture of the solar cell became larger and the equivalent acceptance angle of the solar cell became larger, the Airy pattern is more centralized, thus increasing the amount of introduced light and improving the power generation efficiency of the solar cell. Among the substances that used to construct the three-dimensional structure, substances which have higher refractive index have better ability of improving power generation efficiency. It is effective when the mean refractive index of substances that used to construct the three-dimensional structure is higher than the mean refractive index of environmental substance(s) around the solar cell (generally is air). Another technique of three-dimensional structure to improve the power generation efficiency of the solar cell is using glass, polymer, water (including seawater and freshwater), aqueous solution, organic compound (including hydrocarbons and carbohydrates) or combination thereof to construct the three-dimensional structure. By constructing the synergistic structure on the surface of the solar cell or immersing the solar cell in the liquid of the synergistic structure, we could reducing the temperature of the solar cell by thermal conduction, thermal radiation, thermal convection, flow (e.g. heat convection) or phase change (e.g. evaporation) caused by the substance (in particular liquids, e.g. water, aqueous solution and organic compounds) of synergistic structure to reduce the surface temperature of the solar cell and increase power generation efficiency of the solar cell. The synergistic structure (or three-dimensional structure) comprising liquid which includes water (including seawater and freshwater), aqueous solution, organic compounds (e.g. alcohol and acetone) or combination thereof. The liquid of synergistic structure is effective to reduce the surface temperature of the solar cell and improve the power generation efficiency. Conventional solar cell plate used to construct dissipating device at its back side or around to dissipating heat. One feature of the present invention uses the front side of the solar cell or immersing the solar cell in liquid to dissipating heat. While the increased amount of power generation efficiency generated by dissipating heat is greater than decreased amount of power generation efficiency generated by absorbing light in the synergistic structure, producing the effect of increased power generation efficiency. Further, we could use the constructing substance of synergistic structure to improve power generation efficiency, the constructing substance comprising liquid which includes water (including seawater and freshwater), aqueous solution, organic compounds (including hydrocarbons and carbohydrates) or combination thereof. By the contacting of the liquid and the solar cell, covering uniformly on the surface of the solar cell by the liquid (because of the connected pipes principle), diluting the unfavorable light-receiving impurities adsorbed on the surface of the solar cell, and employing the substances which its mean refractive index higher than the mean refractive index of environmental substances (e.g. air), we could improving interface condition of the solar cell and increasing light introduced into solar cell and improving the power generation efficiency.

The liquid described above is high transmittance liquid, including, but not limited to water (including seawater and fresh water), aqueous solution, organic compounds (including hydrocarbons and carbohydrates) or combination thereof.

The solid described above is high transmittance solid, including, but not limited to quartz, glass, polymer (e.g. plastics) or combination thereof.

According to the method for improving power generation efficiency of a solar cell of the present invention, another aspect of the present invention is to provide a method for improving power generation efficiency of a solar cell, comprising: providing at least a solar cell and at least a synergistic structure, the synergistic structure configured on the solar cell for allowing the solar cell receive light through the synergistic structure; wherein the synergistic structure is a three-dimensional structure. The surface area of the three-dimensional structure is larger than the surface area of the solar cell, thereby increasing light introduced into the solar cell and improving power generation efficiency of the solar cell. The technique to improve power generation efficiency of a solar cell is the use of a principle of the surface area of the three-dimensional structure is larger than the surface area of the solar cell plate, thereby increasing light introduced into the solar cell and improving power generation efficiency of the solar cell. The three-dimensional structure could be a structure formed by solid, liquid, gas or combination thereof, or could be formed by a combination of different substances. The structure formed by liquid, solid or combination thereof is easy to construct. It is preferred that choosing high transmittance solid, high transmittance liquid and combination thereof to be the solid, liquid and combination thereof that use to form the three-dimensional structure. Further, using transparent substance to construct the three-dimensional structure is more preferred. The three-dimensional structure construct on a solar cell to improve power generation efficiency of the solar cell. In addition, the amount of light absorbed by three-dimensional structure affects the amount of light introduced in the solar cell. We need to overcome the amount of light absorbed by three-dimensional structure to increase the amount of light introduced in the solar cell and improve the power generation efficiency. In this case, constructing the synergistic structure on the solar cell could increase the net amount of light received by the solar cell, that is, the increased amount of light greater than absorbed amount of light could increase the power generation efficiency of the solar cell. Thus, it is preferred that the substances, which are used to construct three-dimensional structure, have higher transmittance. Further, using transparent substance to construct the three-dimensional structure is more preferred. Increasing the front area and side area of the three-dimensional structure could increase the amount of introduced light and improve the power generation efficiency of the solar cell. Another technique of three-dimensional structure to improve the power generation efficiency of the solar cell is constructing the three-dimensional structure by high refractive index substances, renders the mean refractive index of the constructing substances is higher than the mean refractive index of environmental substance(s) around the solar cell (e.g. air) and the amount of introduced light per unit area thus increased, therefore improving the power generation efficiency of the solar cell. While the mean refractive index of the synergistic structure (i.e. the three-dimensional structure) is higher than the mean refractive index of environmental substance(s) around the solar cell, the numerical aperture of the solar cell became larger and the equivalent acceptance angle of the solar cell became larger, the Airy pattern is more centralized, thus increasing the amount of introduced light and improving the power generation efficiency of the solar cell. Among the substances that used to construct the three-dimensional structure, substances which have higher refractive index have better ability of improving power generation efficiency. It is effective when the mean refractive index of substances that used to construct the three-dimensional structure is higher than the mean refractive index of environmental substance(s) around the solar cell (generally is air). Another technique of three-dimensional structure to improve the power generation efficiency of the solar cell is using glass, polymer, water (including seawater and freshwater), aqueous solution, organic compound (including hydrocarbons and carbohydrates) or combination thereof to construct the three-dimensional structure. By constructing the synergistic structure on the surface of the solar cell or immersing the solar cell in the liquid of the synergistic structure, we could reducing the temperature of the solar cell by thermal conduction, thermal radiation, thermal convection, flow (e.g. heat convection) or phase change (e.g. evaporation) caused by the substance (in particular liquids, e.g. water, aqueous solution and organic compounds) of synergistic structure to reduce the surface temperature of the solar cell and increase power generation efficiency of the solar cell. The synergistic structure comprising liquid which includes water (including seawater and freshwater), aqueous solution, organic compounds (e.g. alcohol and acetone) or combination thereof. The liquid of synergistic structure is effective to reduce the surface temperature of the solar cell and improve the power generation efficiency. Conventional solar cell plate used to construct dissipating device at its back side or around to dissipating heat. One feature of the present invention uses the front side of the solar cell or immersing the solar cell in liquid to dissipating heat. While the increased amount of power generation efficiency generated by dissipating heat is greater than decreased amount of power generation efficiency generated by absorbing light in the synergistic structure, producing the effect of increased power generation efficiency. Further, we could use the constructing substance of synergistic structure to improve power generation efficiency, the constructing substance includes water (including seawater and freshwater), aqueous solution, organic compounds (including hydrocarbons and carbohydrates) or combination thereof. By the contacting of the liquid and the solar cell, covering uniformly on the surface of the solar cell by the liquid (because of the connected pipes principle), diluting the unfavorable light-receiving impurities adsorbed on the surface of the solar cell, and employing the substances which its refractive index higher than the refractive index of environmental substance(s) around the solar cell (e.g. air), we could improving interface condition of the solar cell and increasing light introduced into solar cell and improving the power generation efficiency.

The device described above could optionally add a supporting device to support and fix the synergistic structure on the upper surface of the solar cell. Optionally, the supporting device supports the synergistic structure and the solar cell at the same time.

For example, the device for improving power generation efficiency of a solar cell could design as FIG. 1; the device 10 comprises a solar cell 11, a synergistic structure 12 and a supporting device 13. The synergistic structure 12 is a structure that a high transmittance solid surrounded the solar cell, the structure includes but not limited to a hollow cylinder 121 (FIG. 1A), a hollow tetragonal prism 121' (FIG. 1B) or a hollow rectangular prism. Further, we could pour high transmittance liquid 122 into the hollow cylinder 121 or the hollow tetragonal prism 121'. In the example, device 10 comprises a supporting device 13, the base of the hollow cylinder 121 or the hollow tetragonal prism 121', to support the synergistic structure 12 and the solar cell 11.

In addition, we could apply the device as shown in FIG. 1 to the solar cell array plate 20, as shown in FIG. 2. In FIG. 2, every solar cell 21 has a synergistic structure 12 separately.

Figure 3:
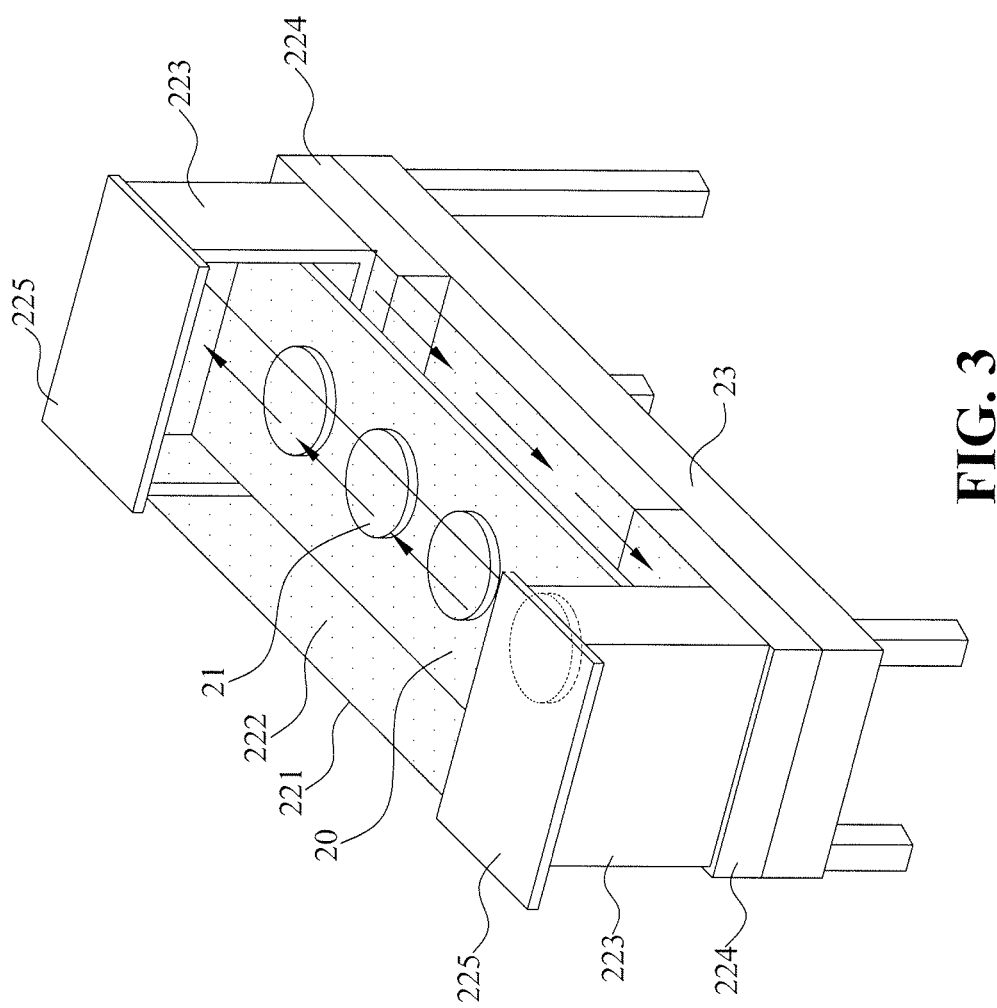
FIG. 3 shows a schema of a solar cell array plate adding a synergistic structure which includes a cycling flow liquid.

FIG. 3 shows the solar cell array plate 20 could add a structure for storing water to cover the solar cell. Here, the synergistic structure comprises a high transmittance solid 221, a high transmittance liquid 222, a reservoir 223, a dissipating device 224 and a sunshade device 225. The high transmittance solid 221 is configured on the solar cell 21; the high transmittance liquid 222 is configured to cover the solar cell plate 20 and flow in a direction as the arrow shown in the FIG. 3. The reservoir 223 uses to store high transmittance liquid 222 and provides sufficient amount of liquid. The dissipating device 224 and sunshade device 225 could reduce the temperature of the high transmittance liquid 222, further improving the power generation efficiency of the solar cell plate 20. Furthermore, configuring a supporting device 23 (a holder in this example) to support the solar cell array plate 20 and the synergistic structure (the high transmittance solid 221, the high transmittance liquid 222, the reservoir 223, the dissipating device 224 and the sunshade device 225) to keep an appropriate angle.

Figure 4:
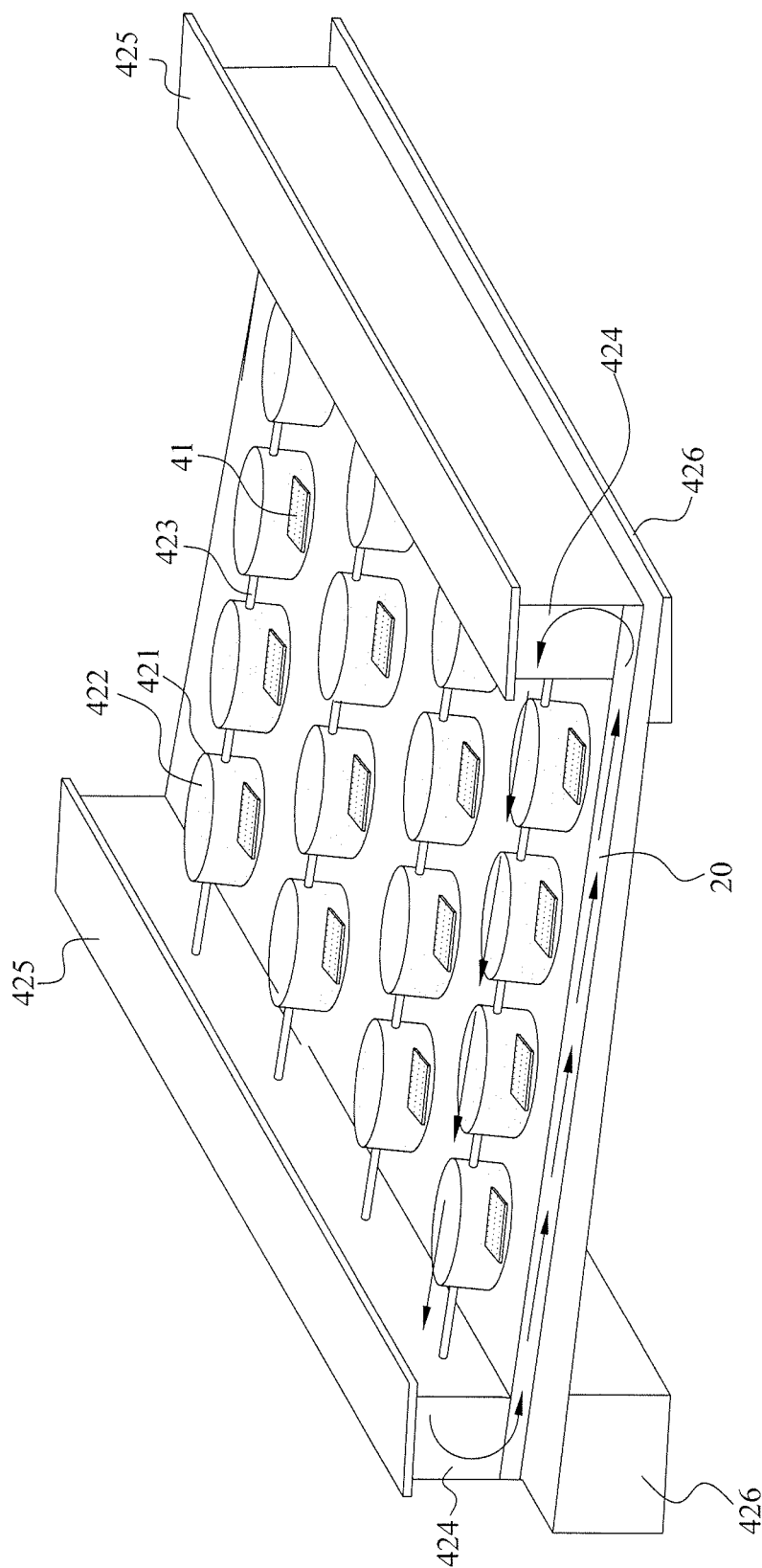
FIG. 4 shows a schema of the device of FIG. 2 and further adds a cycling device, sunshade device and dissipating device.

Furthermore, the device for improving power efficiency of a solar cell of the present invention could also design as shown in FIG. 4, adding a synergistic structure to the solar cell array plate 20 which loads a plurality of solar cells 41. The synergistic structure comprises a plurality of high transmittance solids 421 and a plurality of high transmittance liquids 422 filled therein, a plurality of connecting pipes 423, a storing and cycling device 424, a sunshade device 425 and a dissipating device 426. Configuring connecting tube 423 between every high transmittance solid 421 renders the high transmittance liquids 422 filled in the high transmittance solids 421 could flow through. The storing and cycling device 424 uses to pumping the high transmittance liquids 422 cycles in the high transmittance solids 421. The sunshade device 425 and the dissipating device 426 use to keeping the temperature of the high transmittance liquids 422 stay cooler, thus reduce the temperature of each solar cell 41.

Figure 5A:
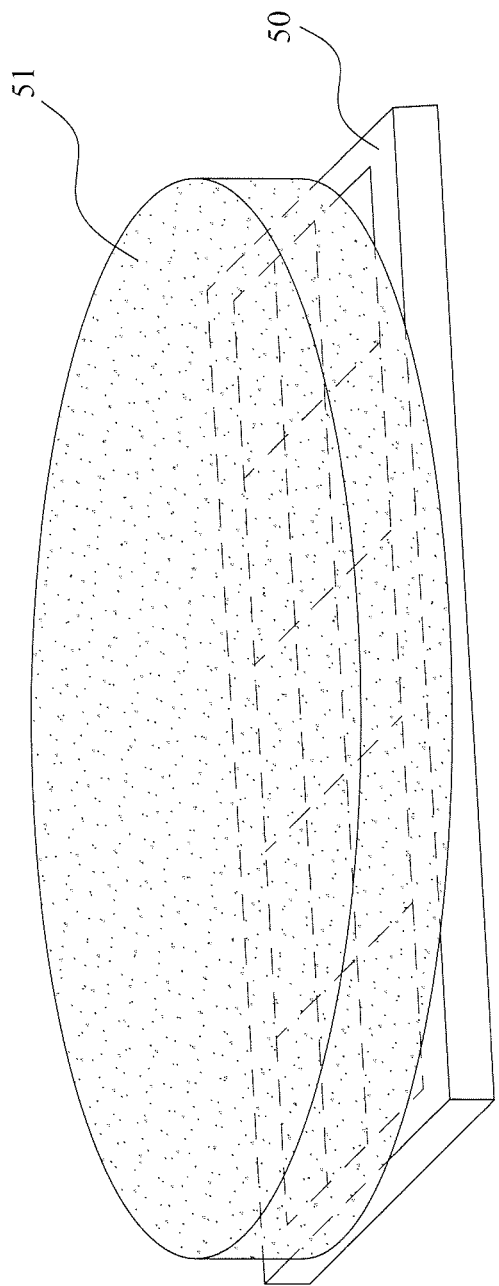
FIGS. 5A and 5B show a schema of the device for improving power generation efficiency of a solar cell of the present invention, wherein the synergistic structure is (A) a high transmittance solid or (B) a combination of a high transmittance solid and a high transmittance liquid.

As shown in FIG. 5A, in another example of the present invention, the synergistic structure 51 could be a solid having a plate shape. The solid cover on the solar cell 50 could improve the power generation efficiency of a solar cell 50. On the other hand, we could also use a container 511 which has a high transmittance base as the synergistic structure 51 and put it on the solar cell 50, shown in FIG. 5B. The container 511 could fill the high transmittance liquid 512 to further improve the power generation efficiency of the solar cell 50.

In another example of the present invention, the device for improving power generation efficiency of a solar cell could apply to the structure of a solar water heater. The solar water heater such as a forced circulation solar water heater which shown in FIG. 6A or a natural circulation solar water heater which shown in FIG. 6B. In the FIGS. 6A and 6B, pipes 611-614 filled with water 610 (or other high transmittance liquid to be heated). The pipe 611 is an inlet pipe, the water in the pipe 611 flows to pipe 613 on the solar cell plate 60 through the pipe 612 under the hot water reservoir 62, wherein the pipe 613 could be a duct or a container with hollow plate shape. The water 610 heated at the pipe 613 flow into reservoir 62, and effusing the hot water through the pipe 614. The bottommost supporting device 63 supports the pipe 612,613 and solar cell plate 60 and keep an appropriate angle. The position of pipe 613 in conventional solar water heater is a heat absorbing region, focus on heat absorption, but the present invention is focus on improving the efficiency of solar cell plate. Thus replacing a heat absorbing device configured at the position of pipe 613 with a solar cell plate, and there is water or other high transmittance liquid on the solar cell. The water is conducted flow through the solar cell plate to be heated by conducting pipes or a hollow plate, the heated water 610 flow into hot water reservoir 62 through the pipe 613 and effusing the hot water through the pipe 614. The cooled water in the reservoir 62 would be reheated by flowing through the pipe 612 and 613. If the temperature of the water in the pipe 613 is too high, we could add water from the pipe 611 to keep the temperature of the solar cell plate cooler. In addition, since there is flowing water on the solar cell plate, the effect of synergistic structure, the refractive index of water higher than the refractive index of air, the effect of improving interface condition of the solar cell, increasing light introduced into solar cell, reducing the temperature of the solar cell by thermal conduction, thermal radiation or evaporation, we could improve the power generation efficiency. In the example of the forced circulation solar water heater as shown as FIG. 6B, there is configured a circulating motor 64 on the pipe 612 to force the water 610 flow through the pipes 611, 612, 613 and reservoir 62.

The following embodiments use to the efficiency of the device and method under various conditions. According to the description in the specification, it would be apparently that a skilled in the art adjusts parts of structure to get a different efficiency value. For example, someone could adjust the material or volume of the liquid in the container (e.g. the material of the liquid could be water or alcohol) or adjust the structure of the device to optimizing the power generation efficiency according to the size of the solar cell.

Embodiment 1

Figure 7:
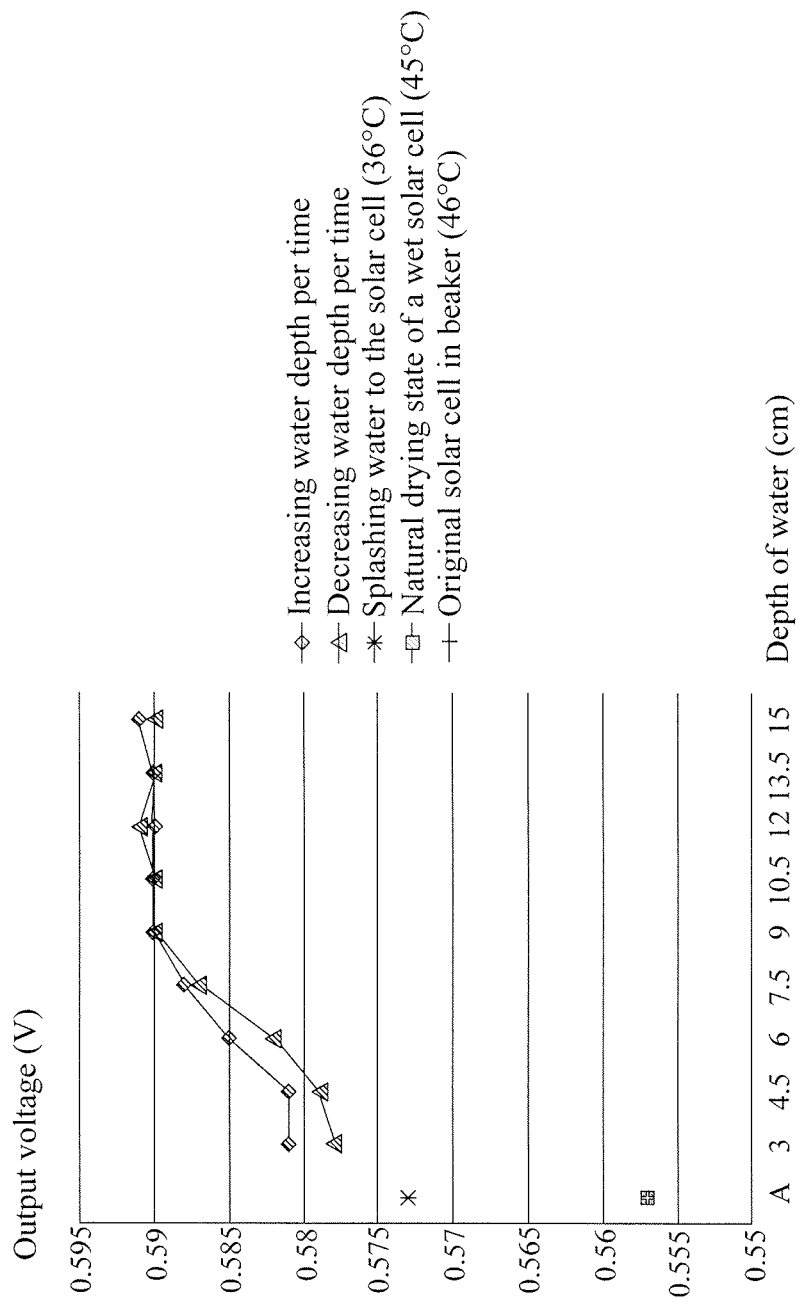
FIG. 7 is a diagram showing the output voltage of a 5 cm×4 cm solar cell in a 2000 c.c. beaker (13 cm in diameter and 19 cm height) with adding water per time.

We follow the schema in FIG. 1A and put a 5 cm×4 cm solar cell plate into a 2000 c.c. beaker (13 cm in diameter and 19 cm in height). The intensity of sunlight is 102000±500 lux. First, measuring the output voltage of the original solar cell, splashing water to the solar cell, and then increasing water depth per time. The result shows in FIG. 7, we found the output voltage increased after splashing or adding water on the solar cell. There is no particular depth corresponds to the point A of the horizontal axis in FIG. 7, the conditions of the point described here or in FIG. 7. When putting the solar cell into the beaker, the temperature of the solar cell rose to 46° C. since sun exposure; the output voltage is 0.557 V. And splashing water to the solar cell, the temperature cooled to 36° C., the output voltage increased to 0.573 V. Then increasing water depth per time, from 3 cm to 15 cm (1.5 cm per time), the output voltage increased from 0.581 to 0.590 V when the depth from 3 cm to 9 cm. when adding the water until the depth of water is 15 cm, decreasing the depth of water and measuring the value of output voltage. When the depth of water back to 3 cm, the output voltage is 0.578 V. Then removing the water on the solar cell and nature drying, the temperature rose to 45° C. and the output voltage is 0.557 V. The change of output voltage during the adding water and decreasing water process is similar.

According to the Embodiment 1, we found that adding water on the solar cell could reduce the temperature of the solar cell by thermal conduction, thermal convection, thermal radiation, phase change (liquid water converted to water vapor by evaporation process) and increase power generation efficiency of the solar cell. The Embodiment 2 described below also confirms this result. The result in this embodiment confirmed that increasing the height of the three-dimensional structure by adding water could improve power generation efficiency of the solar cell. The three-dimensional structure increase the surface area of receiving light, reduce the temperature of the solar cell surface, using the water to construct the three-dimensional structure to improve the conditions of solar cell/air interface (the refractive index of water=1.33 is larger than the refractive index of the environment substance, air≈1), resulting the power generation efficiency of the solar cell increased.

Embodiment 2

Figure 8:
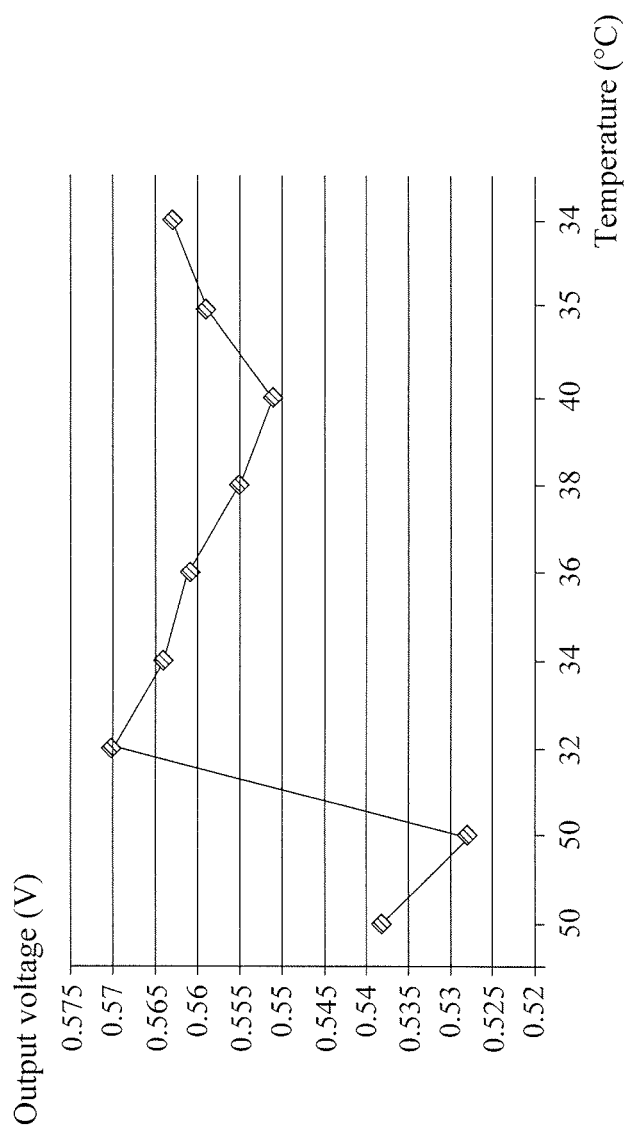
FIG. 8 is a diagram showing the output voltage of a solar cell in/out a 2000 c.c. beaker with/without adding water per time.

Measuring the output voltage and temperature of the solar cell which is out and then in a 2000 c.c. beaker, then adding water to just cover the solar cell and measuring the output voltage and temperature of the solar cell, the data shows in FIG. 8. The light intensity is 80000±500 lux. The explanation according to every temperature value in horizontal axis is described below. When the solar cell is out of the beaker, the temperature is 50° C. and the output voltage is 0.538 V. When the solar cell is in the beaker, the temperature is maintained and the output voltage decreased to 0.528 V. After adding water to cover the solar cell, the temperature reduced to 32° C. and the output voltage is 0.57 V. During the sun exposure, the temperature slowly increased to 40° C. from 32° C. and the output voltage slowly reduced to 0.551 V. Then adding some water, the temperature reduced to 35° C. and the output voltage increased to 0.559 V, then further adding some water, the temperature reduced to 34° C. and the output voltage increased to 0.563 V. It is found that adding water can reduce the work environment temperature of the solar cell and increase its output voltage. This temperature reducing effect is produced by thermal conduction, thermal convection, thermal radiation and phase change (liquid water converted to water vapor by evaporation process). We could add the liquid (water) continually to keep the solar cell cooler, or employ a circulation device (described in Embodiment 10) to drive the water flow and make the solar cell stay cooler, thus improving the power generation efficiency of the solar cell.

In order to prove the increased power generation efficiency is not only because the reduced temperature, but also because adding water. The power generation efficiency increased by adding water at the same temperature of the solar cell has been demonstrated and described in the Embodiment 3.

Embodiment 3

Figure 9:
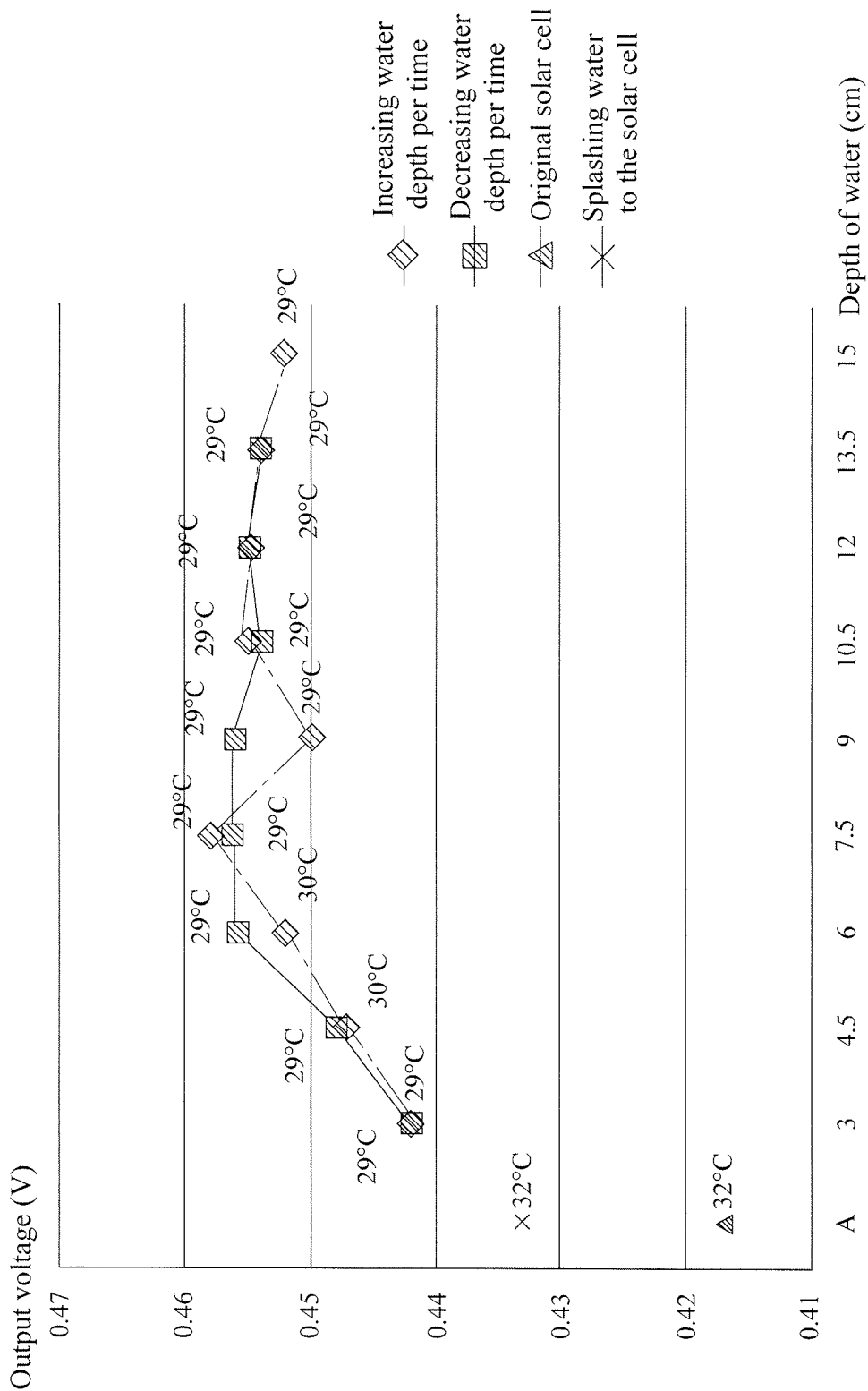
FIG. 9 is a diagram showing the output voltages of a solar cell in a 2000 c.c. beaker with various water depths in a stable temperature condition.

We follow the schema in FIG. 1A and put the solar cell into a 2000 c.c. beaker at 32° C., then we measure the output voltage and temperature before and after splashing water. The illuminance of sunlight is 2620±50 lux. The result shows in FIG. 9. There is no particular depth corresponds to the point A of the horizontal axis in FIG. 9, the conditions of the point described here or in FIG. 9. The output voltage is 0.417 V when the solar cell just put into the beaker. The output voltage increased to 0.433 after adding water, the temperature maintained at 32° C. The reason of the output voltage increased is the water covered the solar cell to improve the original effect of solar cell surface/air interface. When adding water to 3 cm depth, the temperature reduced to 29° C., output voltage increased to 0.422 V. During adding the water to 15 cm, the temperature maintained at 29° C. When water added to 7.5 cm, the output voltage increased to 0.458 V. When water added to 15 cm, the output voltage increased to 0.452 V. Then reducing the water to 3 cm sequentially, the temperature maintained at 29-30° C. and the output voltage is similar to adding water process with the same depth. The temperature was at 32° C. at the beginning, but maintained at 29-30° C. thereafter by thermal conduction, thermal convection, thermal radiation and phase change (liquid water converted to water vapor by evaporation process). According to the result, in addition to the temperature could affect the output voltage, adding water also affect the output voltage by increasing the area of receive light and the refractive index of water is higher than refractive index of air. Compare to the solar cell at 32° C. with no water and 0.417 V output voltage, the output voltage increased about 9% to 0.456 V while the depth of water is 6-7.5 cm. Compare to the original solar cell at 32° C. and 0.417 V output voltage, the output voltage increased to 0.456V, about 9% efficiency increase, while the depth of water is 6-7.5 cm. On the other hand, Compare to the solar cell at 32° C. with splashing water and 0.433 V output voltage, the output voltage increased about 5% while the depth of water is 6-7.5 cm. For the stable light source, we used fluorescent lamps for experiments as the Embodiment 4 below.

Embodiment 4

We follow the schema in FIG. 1A and the solar cell into a 2000 c.c. beaker at 26° C., then we measure the output voltage and temperature before and after splashing water. The illuminance of fluorescent lamps is 600 lux. Sequentially adding water from 3 cm depth to 15 cm depth and sequentially decreasing water to 3 cm, measuring the output voltage during the adding and decreasing water process. The result shows in FIG. 10A. There is no particular depth corresponds to the point A of the horizontal axis in FIG. 10A, the conditions of the point described here or in FIG. 10A. The output voltage of the original solar cell was 0.264 V, and then increased to 0.29 V after adding water, the results supports adding water to the solar cell would improve its power generation efficiency. The reason is adding water would improve the effect of the interface of the solar cell surface and air, renders the output voltage increase and the power generation efficiency increase. Then adding water time by time, the output voltage increased to 0.327 V from 0.307 V, after that, decreasing water time by time, the output voltage decreased to 0.308 V from 0.327 V. This embodiment used stable light source in door to precede the experiment, we could find the output voltage increased by adding water, the result is consistency with the experiment which used the sunlight. We do the same experiment again and the result is shown in FIG. 10B. There is no particular depth corresponds to the point A of the horizontal axis in FIG. 10B, the conditions of the point described here or in FIG. 10B. Because of repeating the experiment, the solar water still wet and its output voltage is 0.274 V. The output voltage is 0.288 V after splashing water on the solar cell. The output voltage increased to 0.326 V from 0.308 V after adding water per time until the water depth from 3 cm to 15 cm, and it decreased to 0.305 V form 0.326V after decreasing the water depth from 15 cm to 3 cm.

The experiment which use the sunlight as a light source have to make sure the intensity of sunlight is stable and have to proceed the experiment as fast as we can. In the contrast, the fluorescent light in door during the night is more stable, but the result of output voltage change trend is consistency.

That is, adding water on the solar cell could improve the output voltage and the efficiency of the solar cell. Therefore, in addition to the effect of temperature and the interface at the surface of the solar cell, the refractive index of water greater than air also improves the amount of light introduced into the solar cell. Further, the water height would increase the side area of the three-dimensional structure increase the amount of light introduced into the solar cell, and affect the output voltage and the efficiency of the solar cell, described in the Embodiment 5 below.

Embodiment 5

Under the sunlight with 1840±10 lux, we followed the schema in FIG. 1A and putted the solar cell into a 2000 c.c. beaker, then we measured the output voltage after adding water from 3 cm to 15 cm, than we also measured the output voltage after decreasing water from 15 cm to 3 cm. The difference between the Embodiment 5 and the Embodiment 4 is that here we covered around the side of the beaker with a black paper just below the water level. The result showed in FIG. 11A. There is no particular depth corresponds to the point A of the horizontal axis in FIG. 11A, the conditions of the point described here or in FIG. 11A. After adding water and before cover the black paper, the output voltage of the solar cell is 0.389 V. Then adding water from 3 cm to 15 cm and covered the black paper just below the water level at each adding water process. The output voltage increased first then decreased during the output voltage 0.404 V to 0.385 V. Then decreasing water from 15 cm to 3 cm and also covered the black paper just below the water level at each adding water process, the output voltage changed to 0.405 V from 0.385 V. The output voltage at the same water depth in adding and decreasing water process shows a slight difference is because the position of the solar cell change cause by adding or decreasing water. Repeating the experiment with 29° C., 626 lux fluorescent light, the result showed in FIG. 11B. There is no particular depth corresponds to the point A of the horizontal axis in FIG. 11B, the conditions of the point described here or in FIG. 11B. The output voltage of the original solar cell was 0.250 V, and increased to 0.268 V after splashing water, then increased to 0.300 V from 0.289 V while the water depth increased to 15 cm form 3 cm, lastly, decreased to 0.289 V from 0.291 V while the water depth decreased to 3 cm from 15 cm.

Figure 10A:
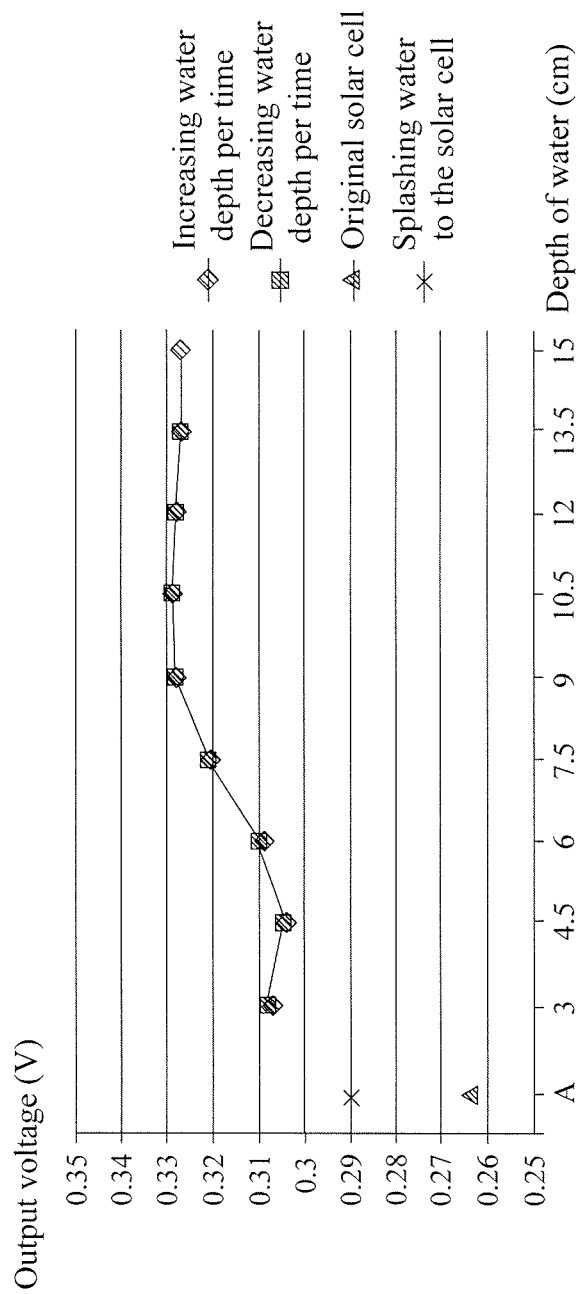
FIGS. 10A and 10B are diagrams showing (A) the output voltage of a solar cell in a 2000 c.c. beaker with various water depths (using indoor light source); (B) the repeat experiment of (A).
Figure 10B:
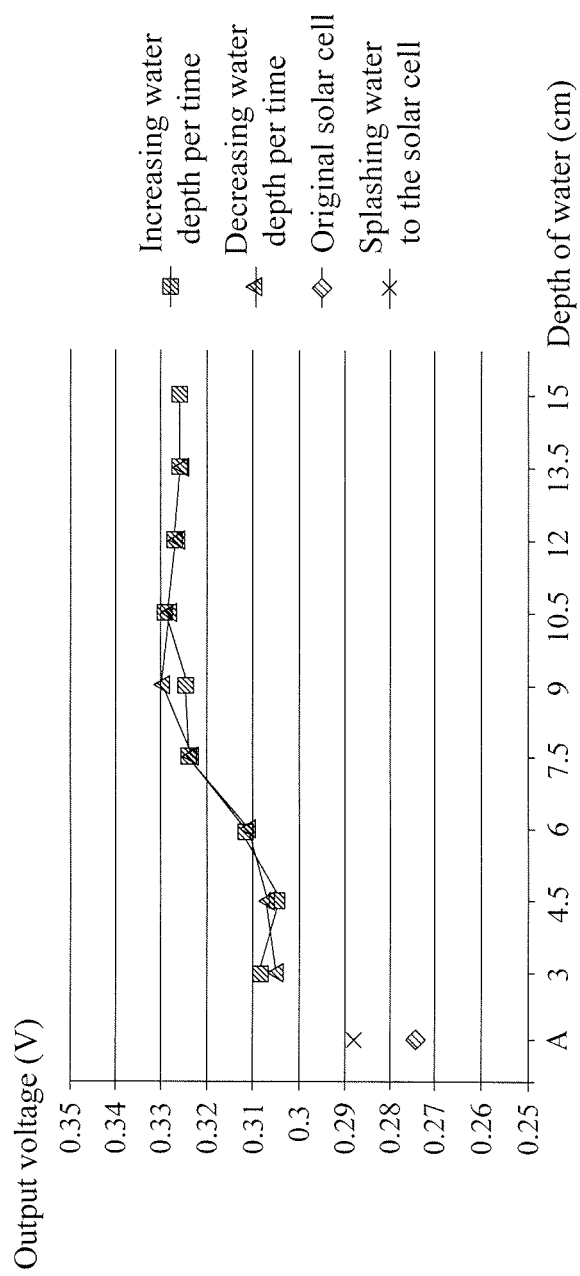
Figure 11A:
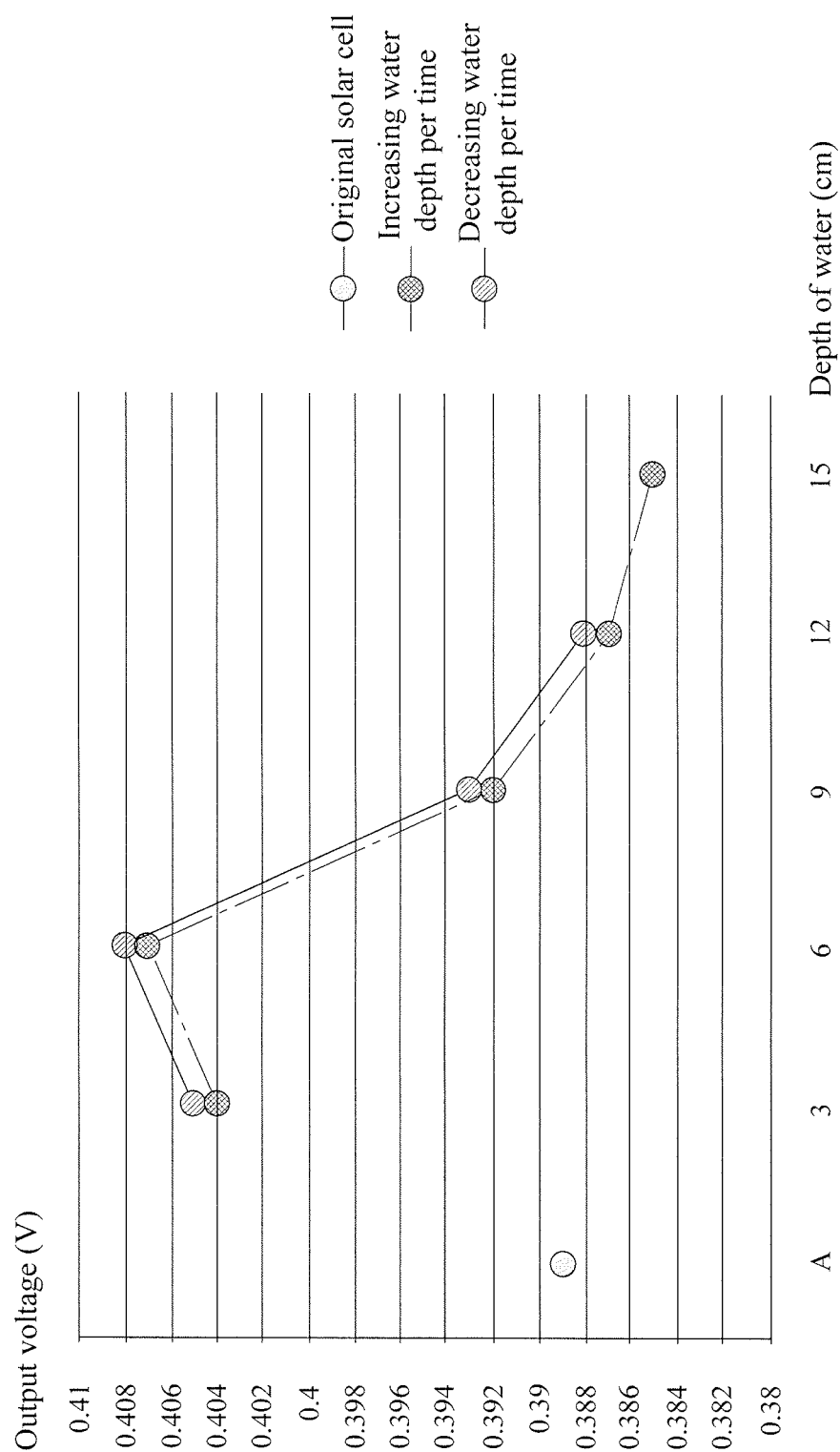
FIGS. 11A and 11B are diagrams showing the (A) the output voltage of a solar cell in a 2000 c.c. beaker with various water depths and a black paper covered around the beaker just below the water level (using sunlight); (B) the repeat experiment of (A) but using indoor light source instead.
Figure 11B:
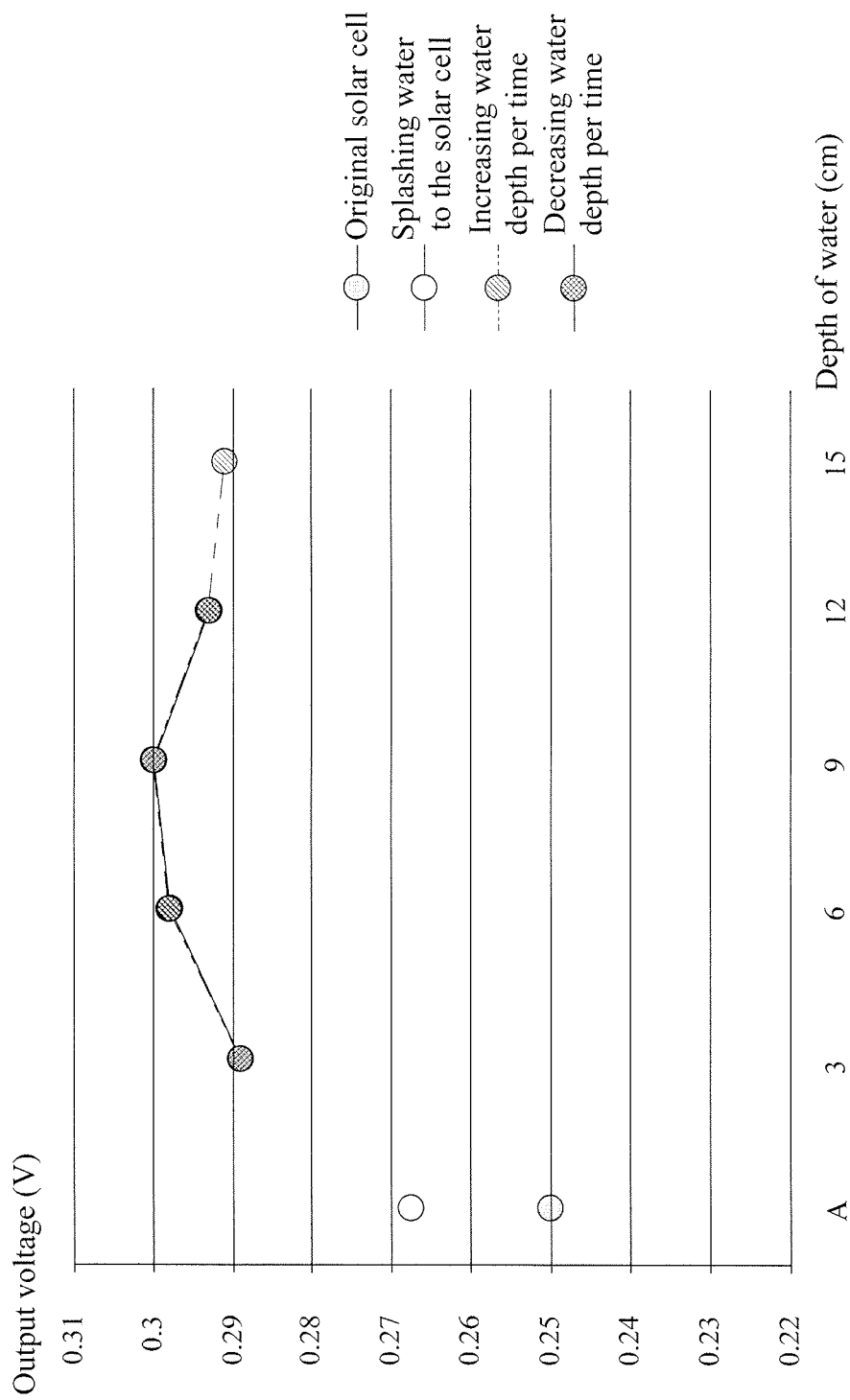

Compare to the Embodiments 4 and 5, also refers to FIGS. 10A, 10B and 11B, we could find the power generation efficiency of the solar cell increased according to the increased water depth whether there was a black paper surrounded or not. In FIGS. 11A, 10B and 11B, the output voltage of the solar cell, which is not a black paper surrounded the beaker, increased 0.038-0.042 V during splashing water to adding water to 9 cm water depth. While after covering the black paper, the output voltage of the solar cell increased 0.032 V, thus we can find the both of front and side of the three-dimensional structure contribute the improving result in the power generation efficiency.

According to the result of the Embodiment 5, we could find that constructing a three-dimensional structure could improve the output voltage and the power generation efficiency of a solar cell. The three-dimensional structure includes solid, liquid or combination thereof. In this embodiment used water as the liquid and glass as the solid, and the output voltage and the power generation efficiency of a solar cell increased. According to the experiment data, the three-dimensional structure, which includes liquid, has many choices. We described using alcohol as the liquid in the Embodiment 6 below.

Embodiment 6

Figure 12:
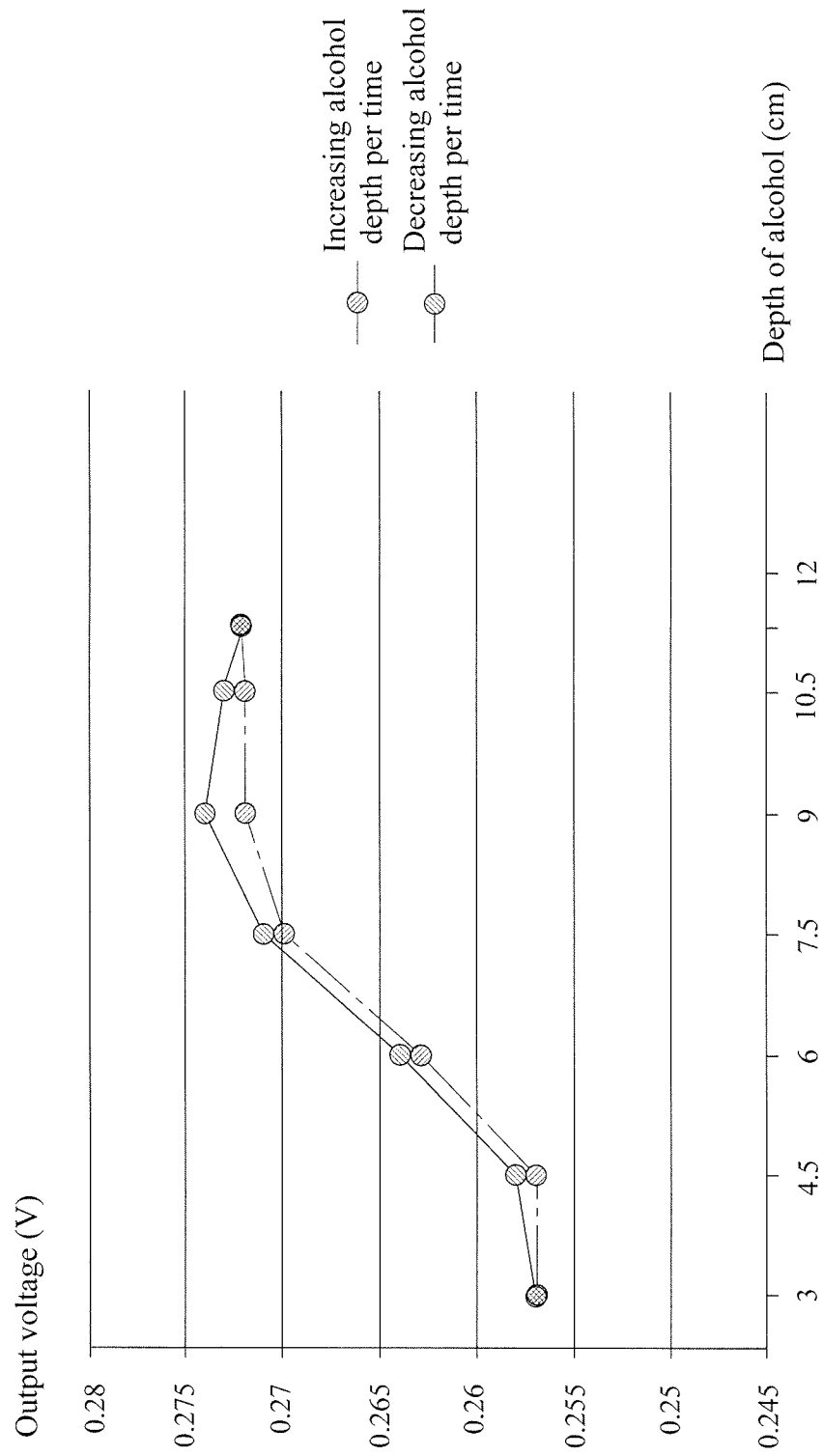
FIG. 12 is a diagram showing the output voltage of a solar cell in a 2000 c.c. beaker with various alcohol depths (using indoor light source).

We followed the schema in FIG. 1A and putted the solar cell into a 2000 c.c. beaker as the Embodiment 4, then we measured the output voltage under 471 lux fluorescent light, the result showed in FIG. 12. The output voltage of the original solar cell is 0.217 V, and then increased to 0.229 V after dipped the alcohol. The output voltage is 0.23 V after splashing alcohol on the solar cell; the increased output voltage is because the adding liquid to the solar cell could improve the interface of the solar cell and air and improve the power generation efficiency. The output voltage increased to 0.272 V from 0.257 V during the water depth from 3 cm to 11.25 cm, then decreased to 0.257 V from 0.272 V during the water depth from 11.25 cm to 3 cm. According to this embodiment, we found that in addition to adding the three-dimensional structure to reduce temperature and improve the effect of interface could increase the power generation efficiency of the solar cell, the liquid increase equivalent receiving light area and the increased refractive index (the refractive index of alcohol is about 1.36, higher than the refractive index of air, 1) also contributes the efficiency of the solar cell increased.

According to the embodiments above, the three-dimensional structure is diversification, so we could use appropriate liquid, solid or combination thereof to improve the power generation efficiency of the solar cell.

Therefore, the present invention focus on constructing a three-dimensional structure on a solar cell could improve the power generation efficiency of the solar cell.

Embodiment 7

Figure 13:
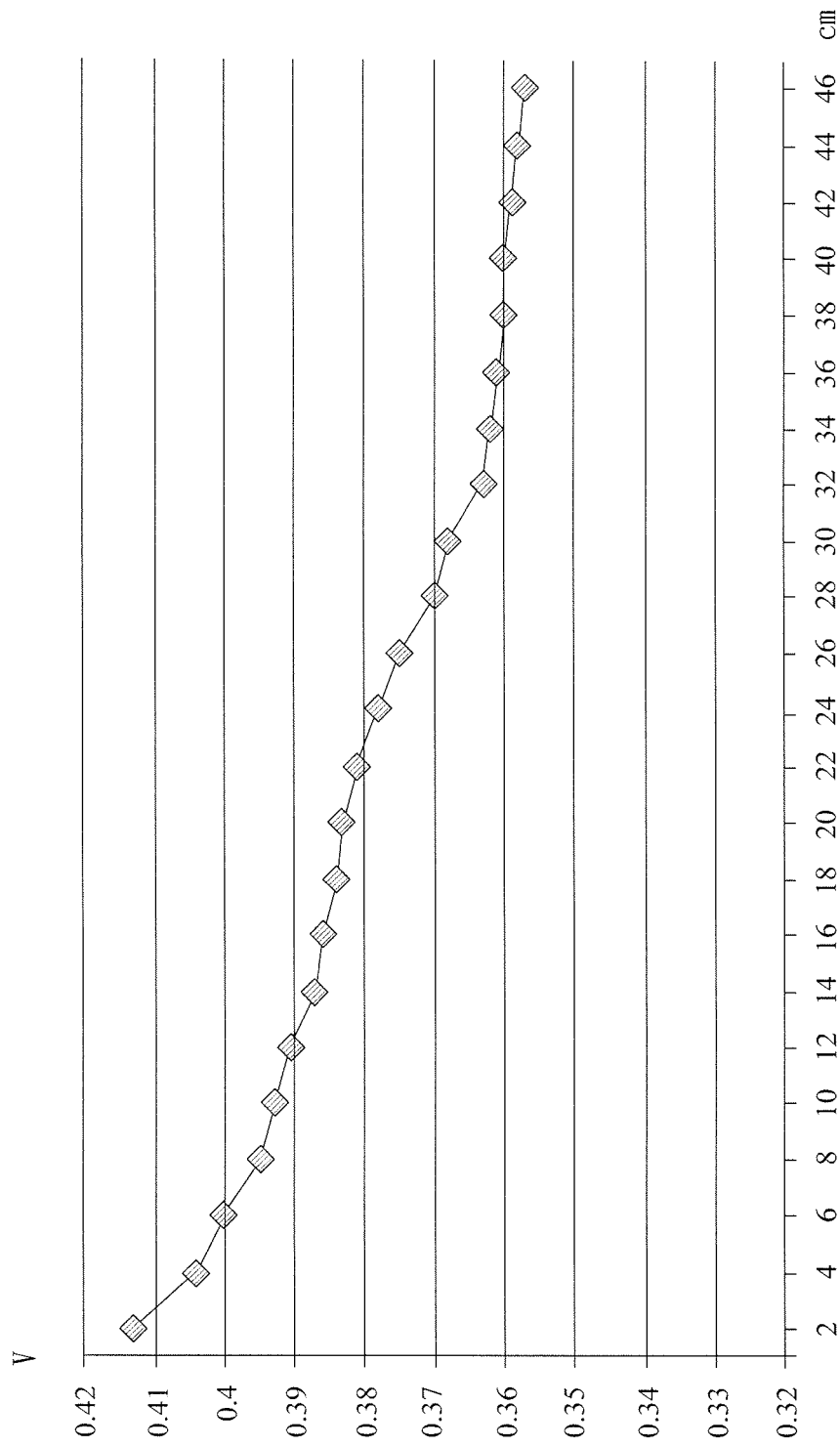
FIG. 13 is a diagram showing the output voltage of a solar cell in an outdoor 72 cm×52 cm×60 cm opaque plastic tank with various water depths.

For further explanation the effect of the three-dimensional structure, proceeding an experiment that putting a solar cell into an opaque plastic tank (length: 72 cm; width: 52 cm; height: 60 cm) under a 25100±2000 lux sunlight condition. Adding water until water depth achieved 46 cm and measuring the output voltage, the result showed in FIG. 13. We found that adding water per time would decrease the output voltage, thus the power generation of the solar cell wasn't increased.

Figure 14:
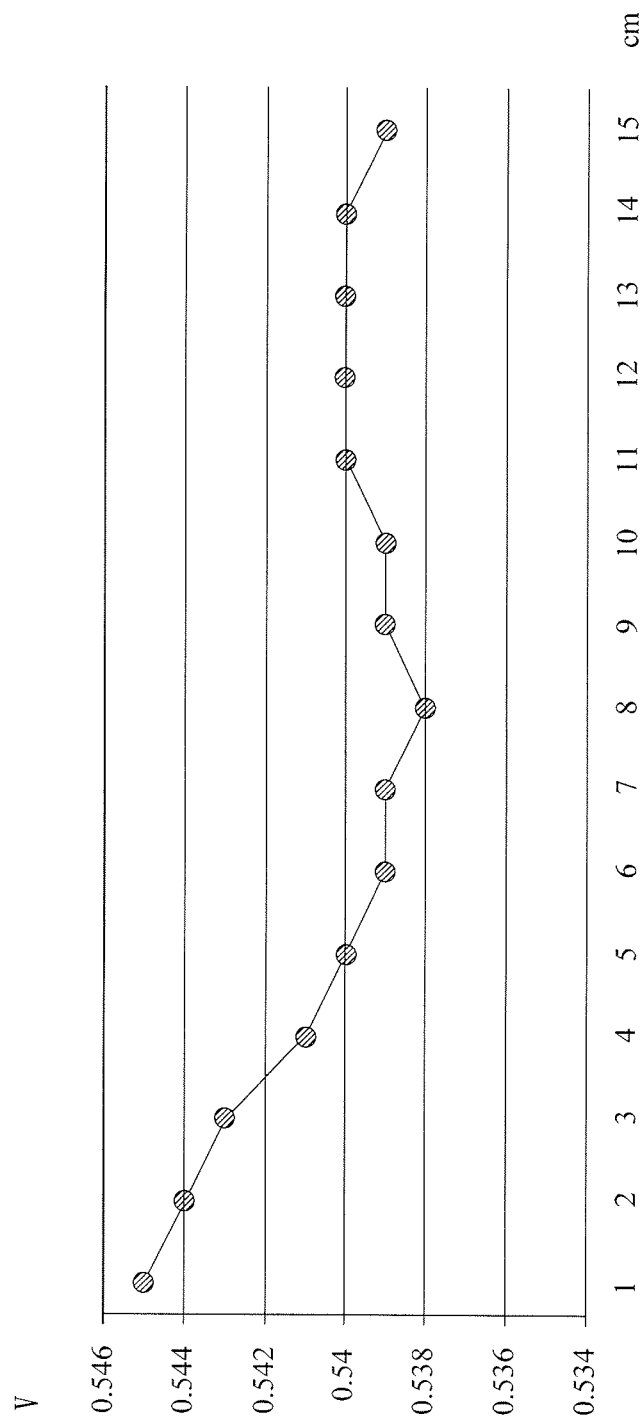
FIG. 14 is a diagram showing the output voltage of a solar cell in an outdoor 44 cm×24 cm×27 cm glass aquarium with various water depths.

Proceed another experiment, we putted the solar cell into a 44 cm length×24 cm width×27 cm height glass aquarium outdoor. The intensity of sunlight is 24800±500 lux. The result showed in FIG. 14, we found the output voltage decreased while the water depth increased.

According to the two experiments above, we found that immersing the solar cell into water or alcohol in some cases could improve the power generation efficiency, but not all cases are effective. We should consider the other conditions (e.g. transmittance) and choose appropriate three-dimensional structure to improve the power generation efficiency of the solar cell.

Embodiment 8

Figure 15:
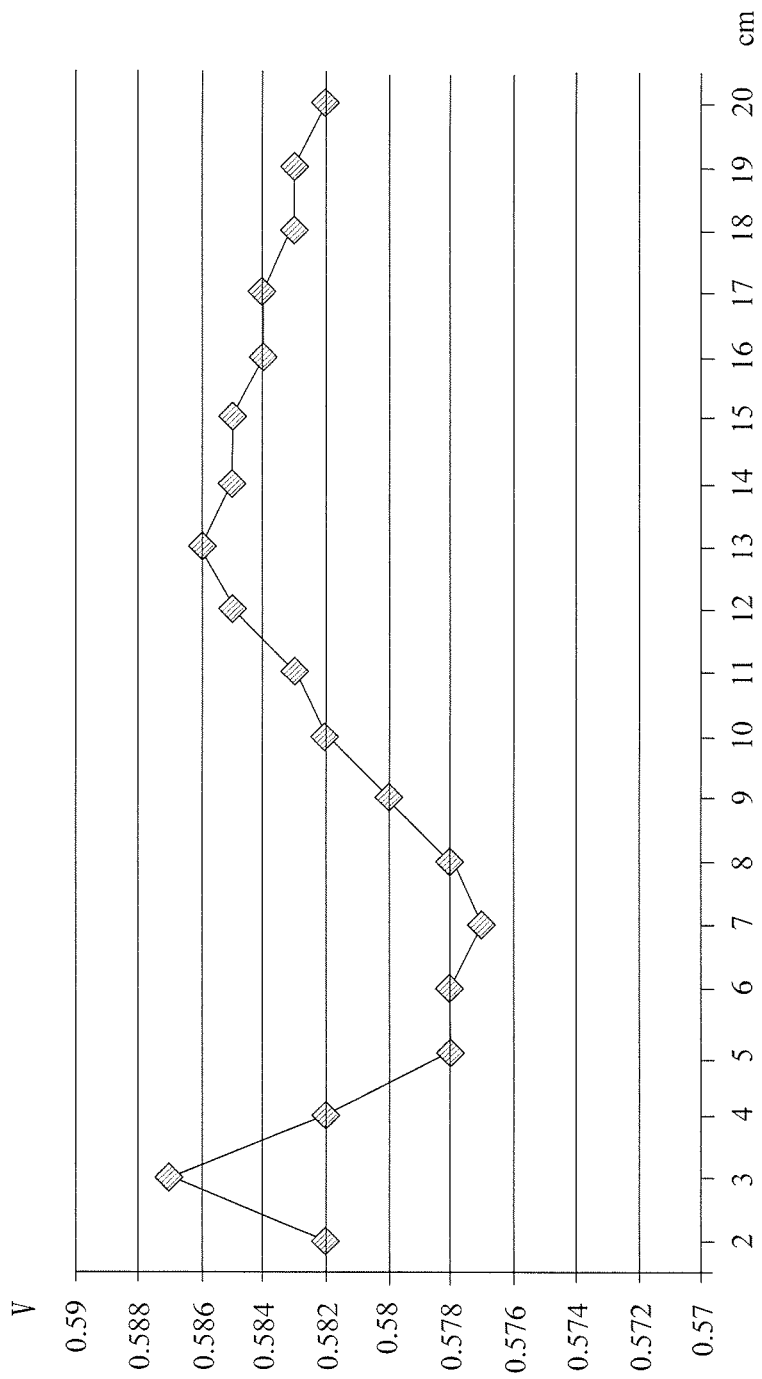
FIG. 15 is a diagram showing the output voltage of a solar cell in an outdoor 25 cm×25 cm×28 cm glass aquarium with various water depths.

In order to explanation the effect of the three-dimensional structure, we putted the solar cell into a 25 cm length×25 cm width×28 cm height glass aquarium under 57000±500 lux sunlight intensity environment. We added water till 20 cm depth and measured the output voltage of the solar cell, the result showed in the FIG. 15. We could found the output voltage slightly increased while water depth increased in the figure, especially at 3 cm and 13 cm.

According to the result above, the appropriate three-dimensional structure could improve the power generation efficiency of the solar cell.

Embodiment 9

Figure 16:
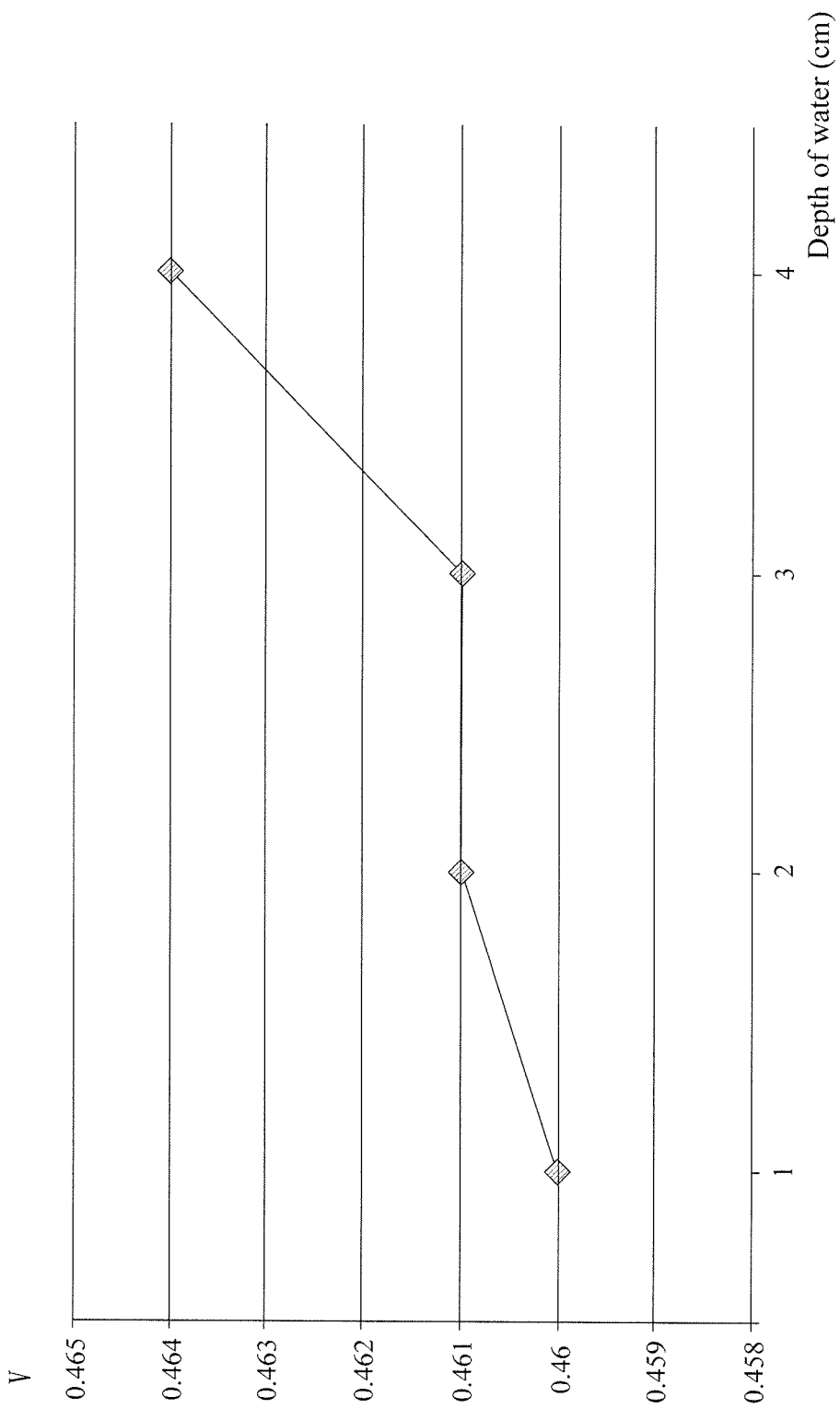
FIG. 16 is a diagram showing the output voltage of a solar cell in an 18 cm×12.5 cm×6 cm glass dish with various water depths.

We followed the schema in FIG. 1B and putted the solar cell into an 18 cm length×12.5 cm width×6 cm height glass dish. The intensity of sunlight was 2500±10 lux. We measured the output voltage of the solar cell and showed the result in FIG. 16. Adding water into the glass dish to increase the three-dimensional structure and increase the output voltage of the solar cell from 0.459 V (1 cm) to 0.467 V (4 cm). This embodiment proved that adding a synergistic structure could improve the power generation efficiency of the solar cell.

Embodiment 10

Figure 6A:
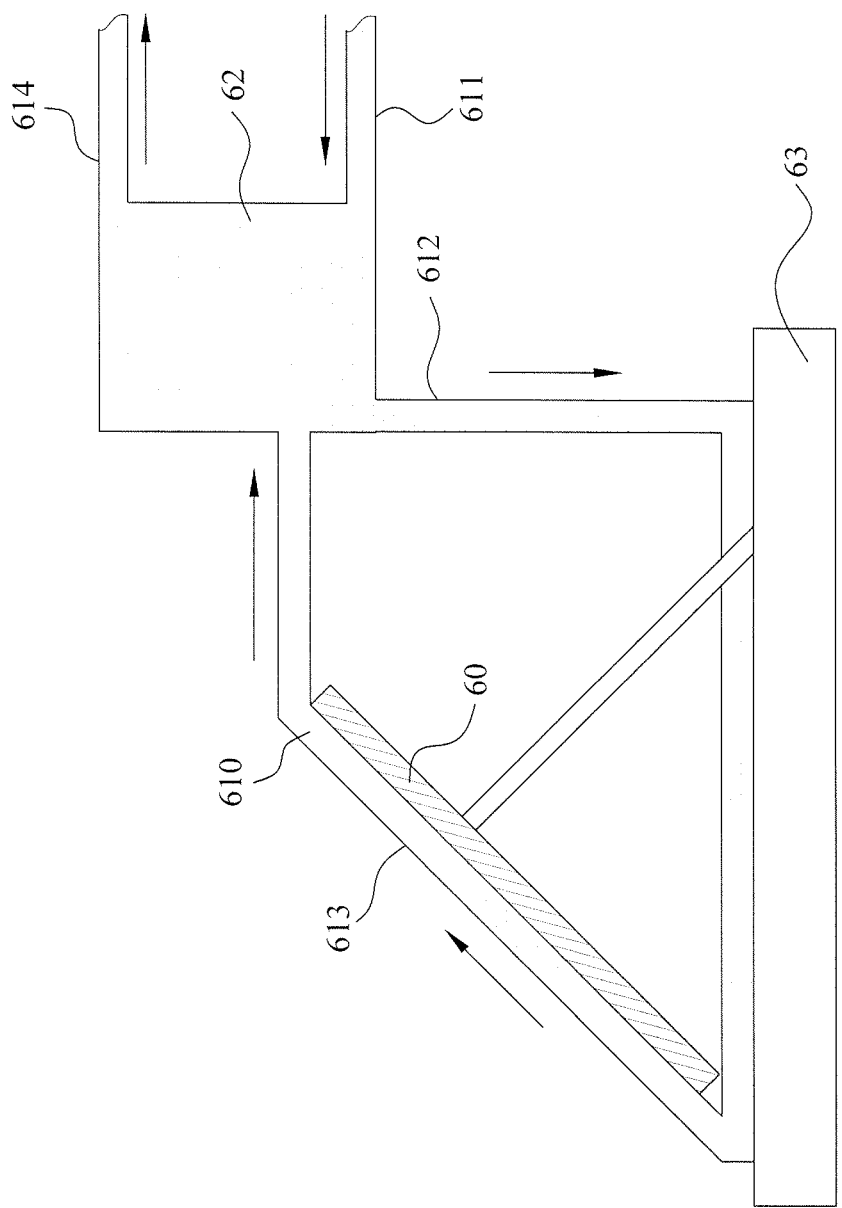
FIGS. 6A and 6B show a schema of the device for improving power generation efficiency of a solar cell of the present invention, wherein the device integers a solar water heater, the solar water heater is (A) a forced circulation solar water heater or (B) a natural circulation solar water heater.
Figure 6B:
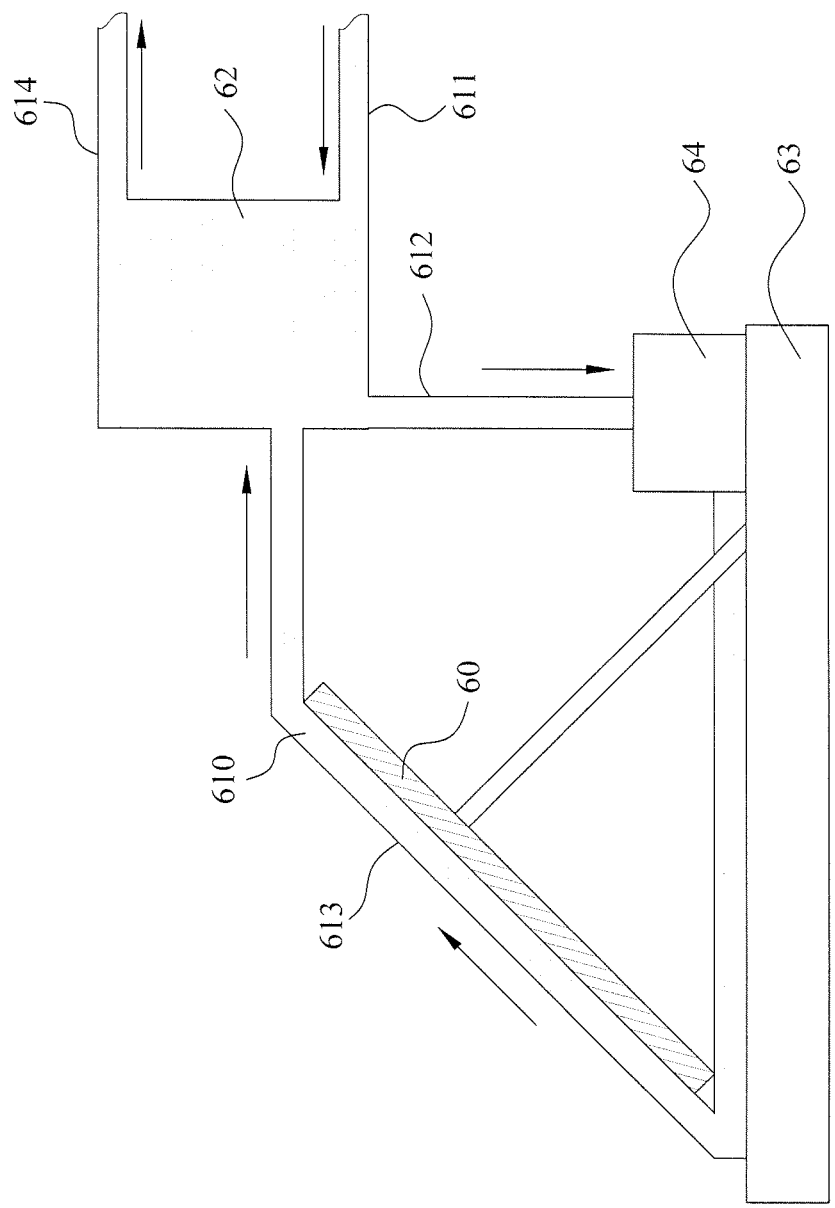
Figure 17:
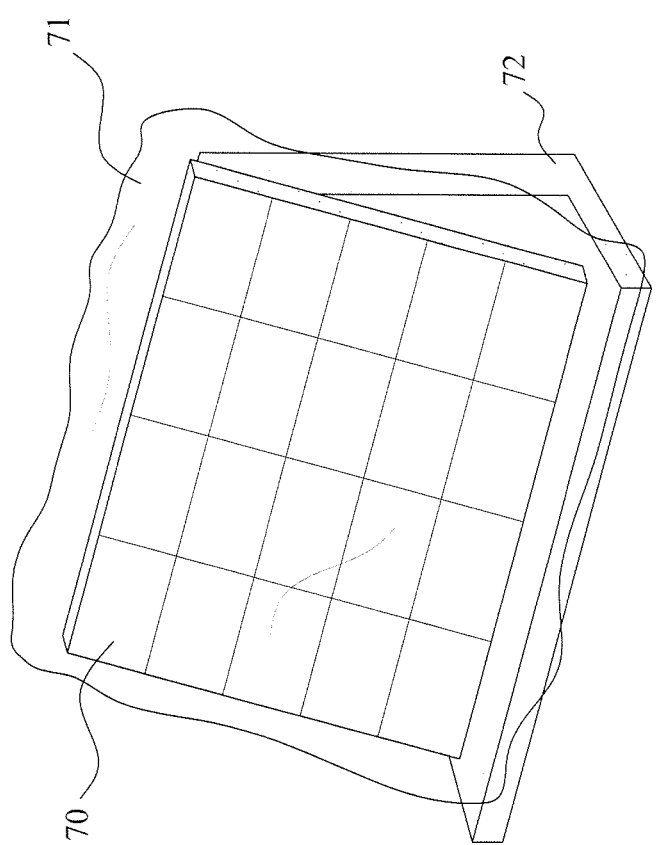
FIG. 17 shows a schema of the embodiment 10.
Figure 18A:
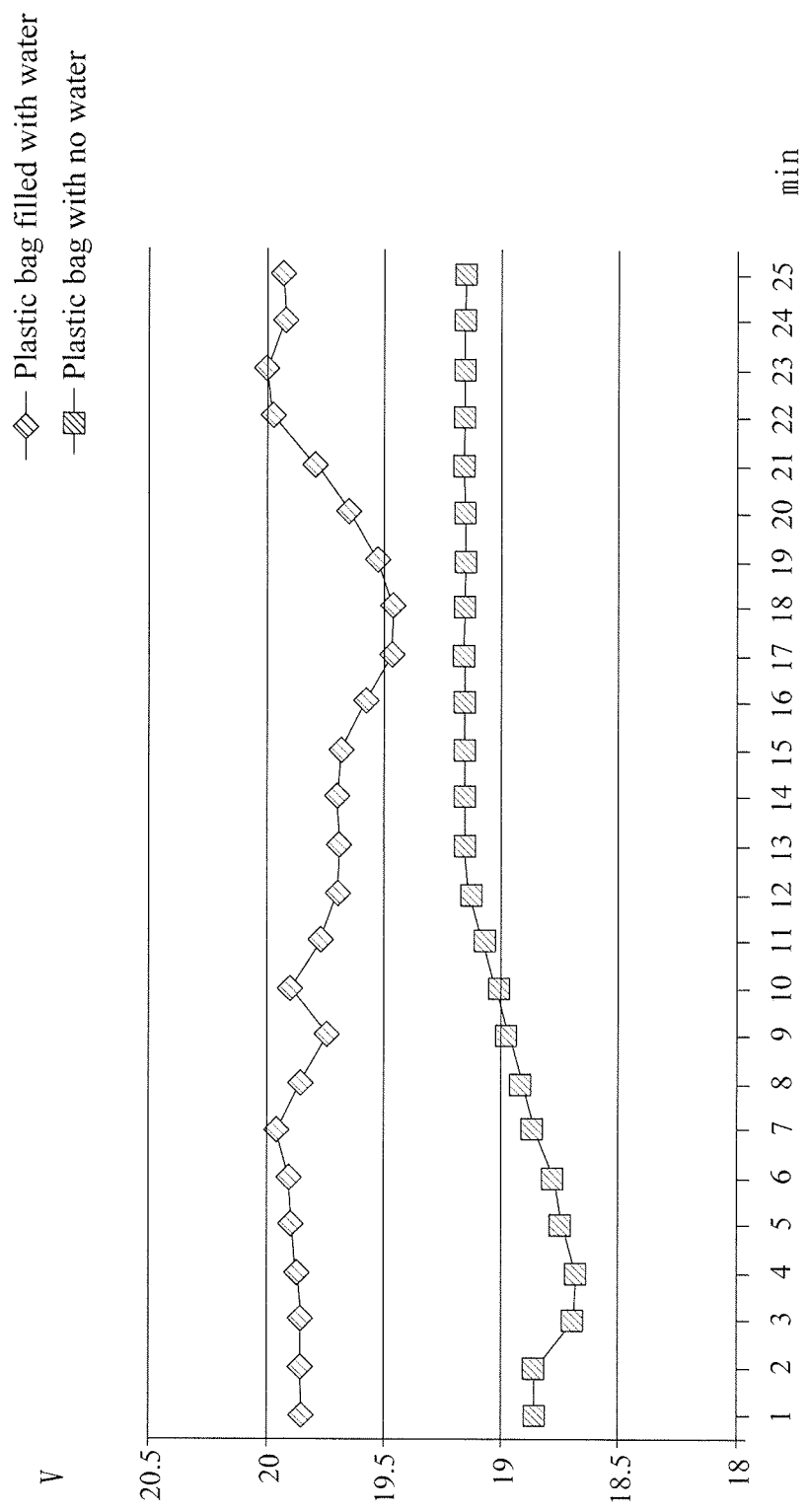
FIGS. 18A and 18B are diagrams showing that (A) followed the schema in FIG. 17 and made an 8×9 solar cells array and retained 2 mm between each solar cell, the size of each solar cell was 3.8 cm×2.6 cm, the size of the solar cell array plate was 31.5 cm×25 cm, and measured the output voltage without water or with various water depths (using sunlight). (B) the illuminance condition during experiment (A).
Figure 18B:
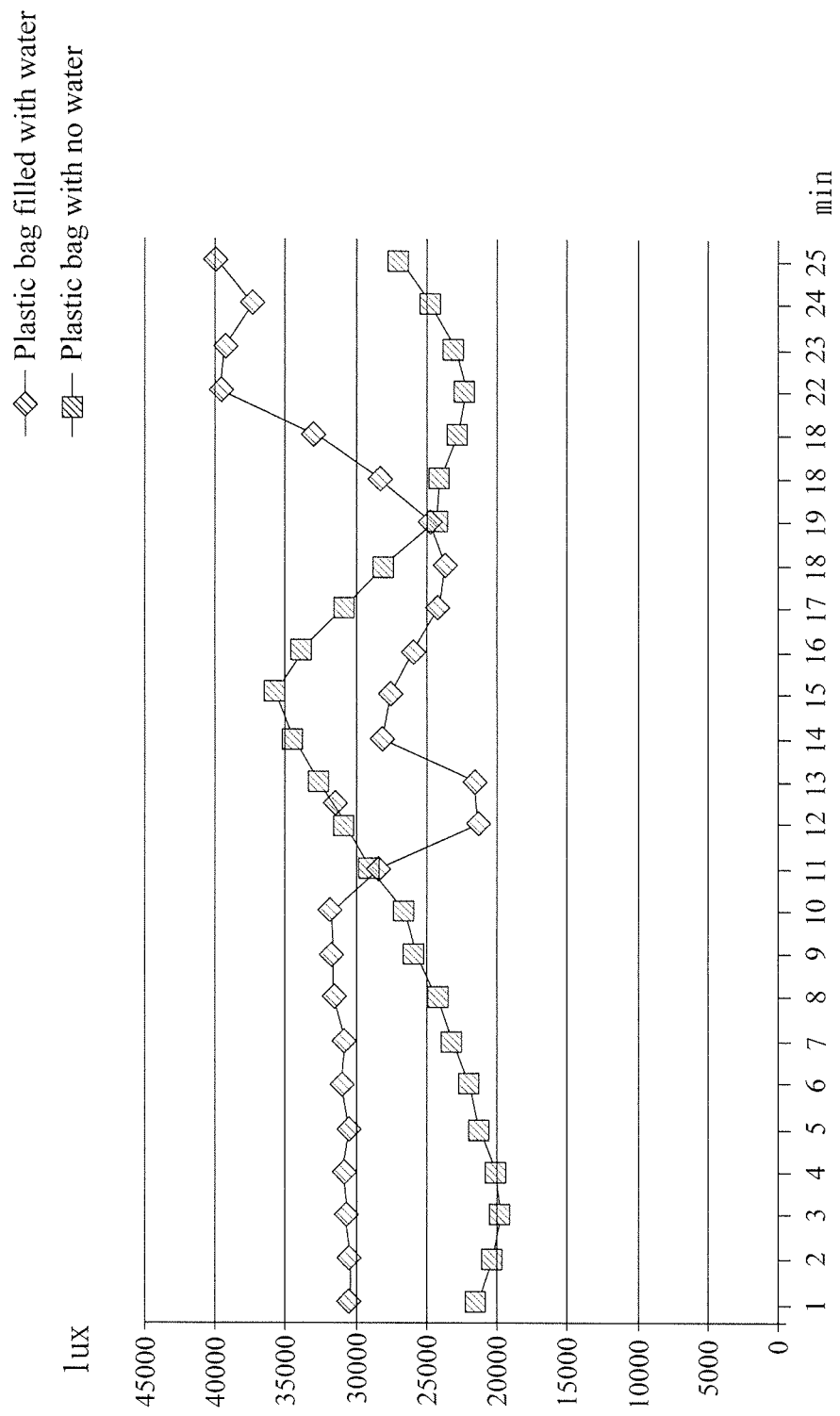

Referring to FIG. 3, FIGS. 6A and 6B, the solar cell array plate combined with a synergistic structure that could store water to cover the solar cell and the water flows for keep the temperature cooler, thus the power generation efficiency of the solar cell could be improved. In order to explanation the embodiment, we made a 8×9 solar cells array and retain 2 mm between each solar cell. The size of each solar cell was 3.8 cm×2.6 cm, the size of the solar cell array plate was 31.5 cm×25 cm. We followed the schema in FIG. 17 and putted the solar cell plate 70 into a synergistic structure 71 (40×60 cm plastic bag, the experiment proceeded with or without filling water). The solar cell array plate 70 and the synergistic structure 71 were supported by a supporting structure 72. Then we measured the output voltage of the solar cell array plate while the plastic with/without water (each for 25 min) and showed in FIG. 18A. Because of the greater illuminance change, we also measured the illuminance change during measuring time and showed in FIG. 18B. According to the figures, we found that the power generation efficiency significantly improved while the plastic bag filled with water. This embodiment also proved that applying the synergistic structure to the solar cell could improve the power generation efficiency through increasing the equivalence surface area of receiving light, decreasing surface temperature of the solar cell, the refractive index of the liquid (water's refractive index is 1.33) is greater than environment (air, 1), and improving the interface of solar cell by adding liquid. Regarding the effect of decreasing temperature of the solar cell, the temperature increased to 31.9° C. from 30° C. during 25 mins measuring time without adding water, on the other hand, the temperature maintained with 23.5° C. from 24.1° C. during 25 mins measuring time after adding water. The result proved that the water decreased the temperature through thermal conduction, thermal radiation, evaporation and flowing.

Embodiment 11

We followed the schema in FIG. 5A to prove the power generation efficiency of solar cell would improve while the three-dimension structure is solid. The intensity of sunlight is 19000±200 lux. The output voltage of the original solar cell is 0.534 V, the output voltage increased to 0.538 V while adding a quartz plate with 8 cm in diameter and 6 mm in height. The output voltage further increased to 0.539V while further adding a 15 cm length×15 cm width×3 mm height quartz plate. We found that adding appropriate solid would improve the power generation efficiency of the solar cell. This result proved that the three-dimension structure could increase the surface area to receiving light, and also proved that the power generation efficiency improved by the refractive index of the quartz plate (about 1.46) is higher than environment substance (air).

Embodiment 12

Figure 19A:
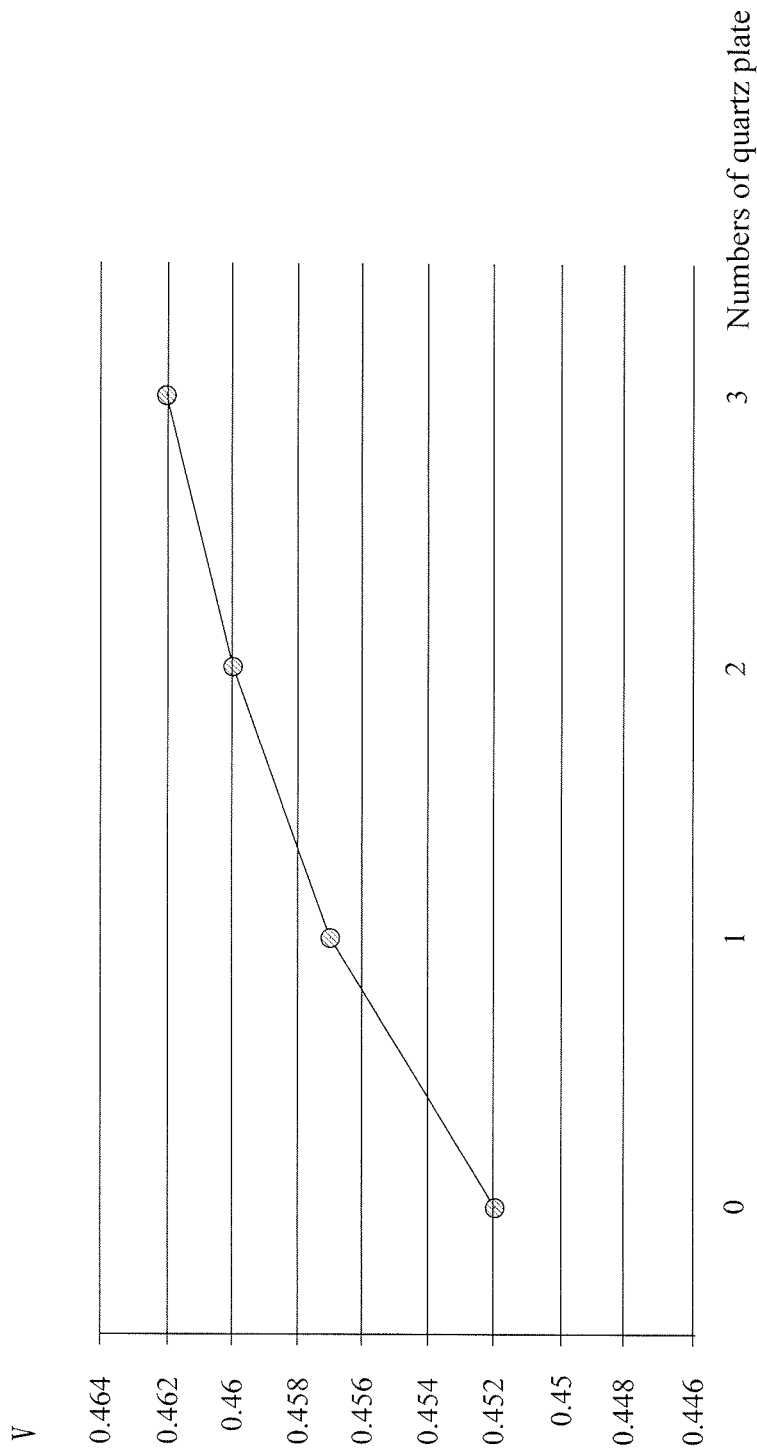
FIGS. 19A and 19B are diagrams showing that (A) the output voltage of a solar cell cover with various quartz glass heights; (B) the repeat experiment of (A).
Figure 19B:
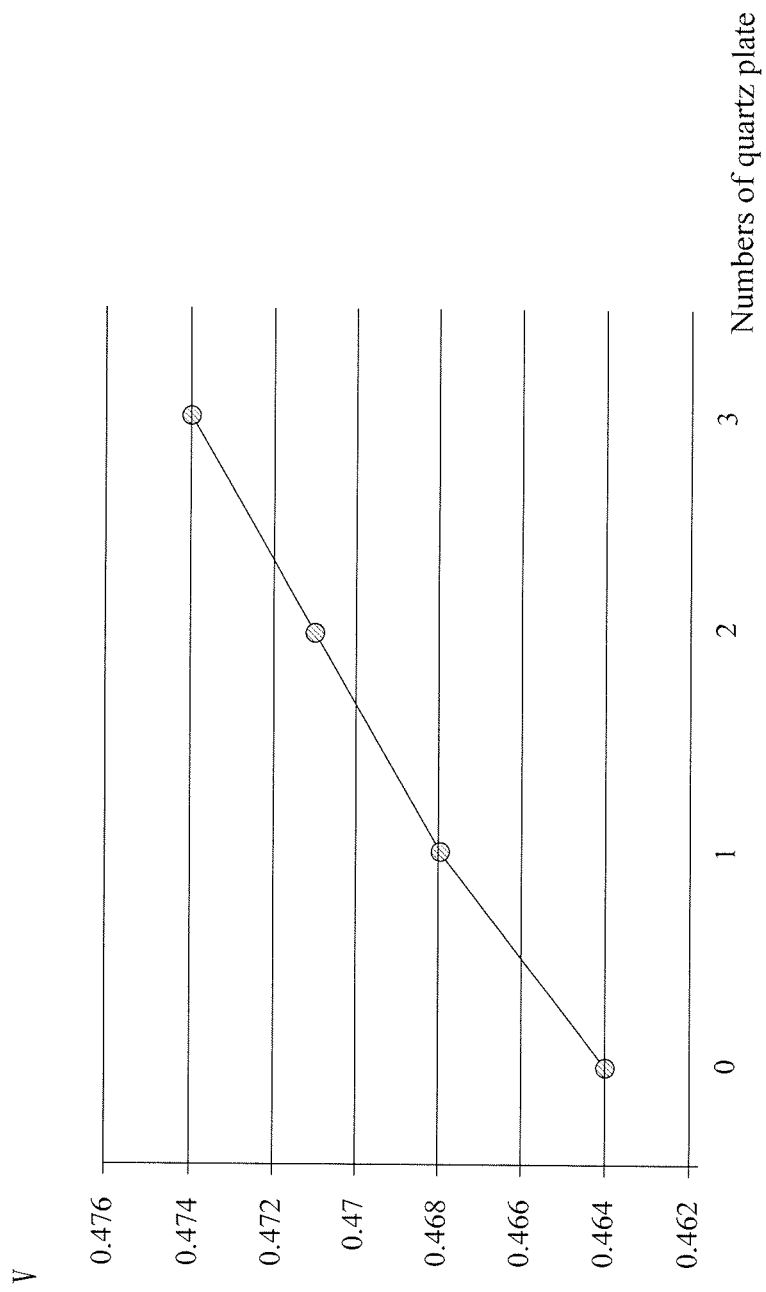

We followed the schema in FIG. 5A, sequentially adding 3 quartz plate with 8 cm in diameter and 6 mm in height on a solar cell under 5000±50 lux sunlight, the output voltage change showed in FIG. 19A. The output voltage of the original solar cell is 0.452 V, then increased to 0.457 V while adding a quartz plate, and increased to 0.460 V and 0.462 V while further adding the second and third quartz plate. Repeat the same experiment under the environment of 26° C. and 6000±20 lux sunlight. The output voltage of the original solar cell is 0.464 V, and increased to 0.468 V, 0.471 V and 0.474 V while sequentially adding 3 quartz plates, the result showed in FIG. 19B. The result further proved that solid could improve the power generation efficiency of the solar cell and had consistency with embodiment 11. The result also proved that the power generation efficiency could be improved by the three-dimension structure could increase the surface area to receiving light, and the refractive index of the quartz plate (about 1.46) is higher than environment substance (air).

Embodiment 13

Figure 5B:
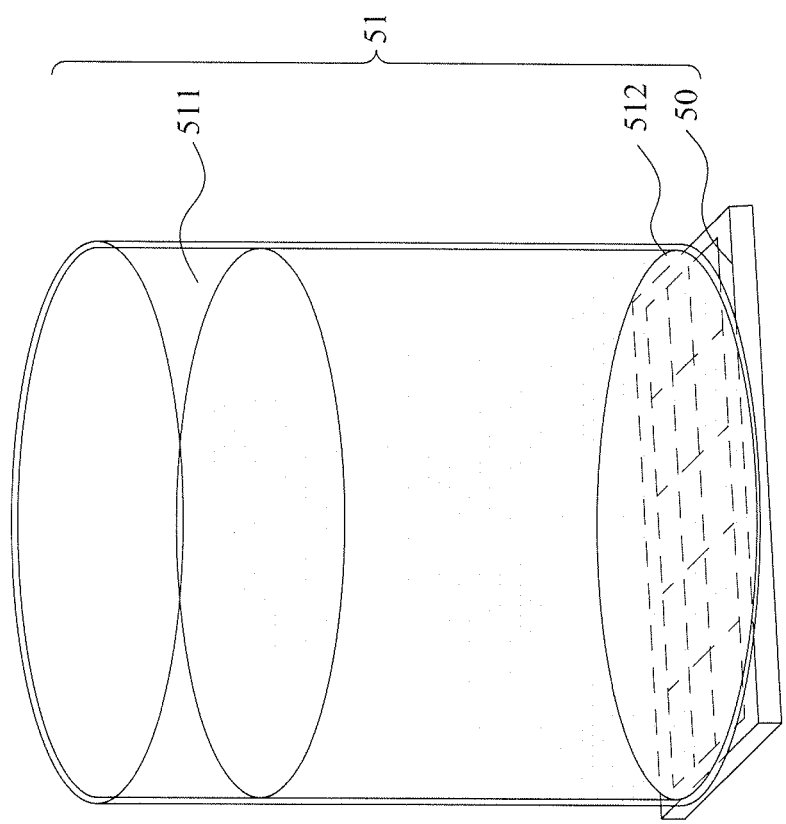
Figure 20:
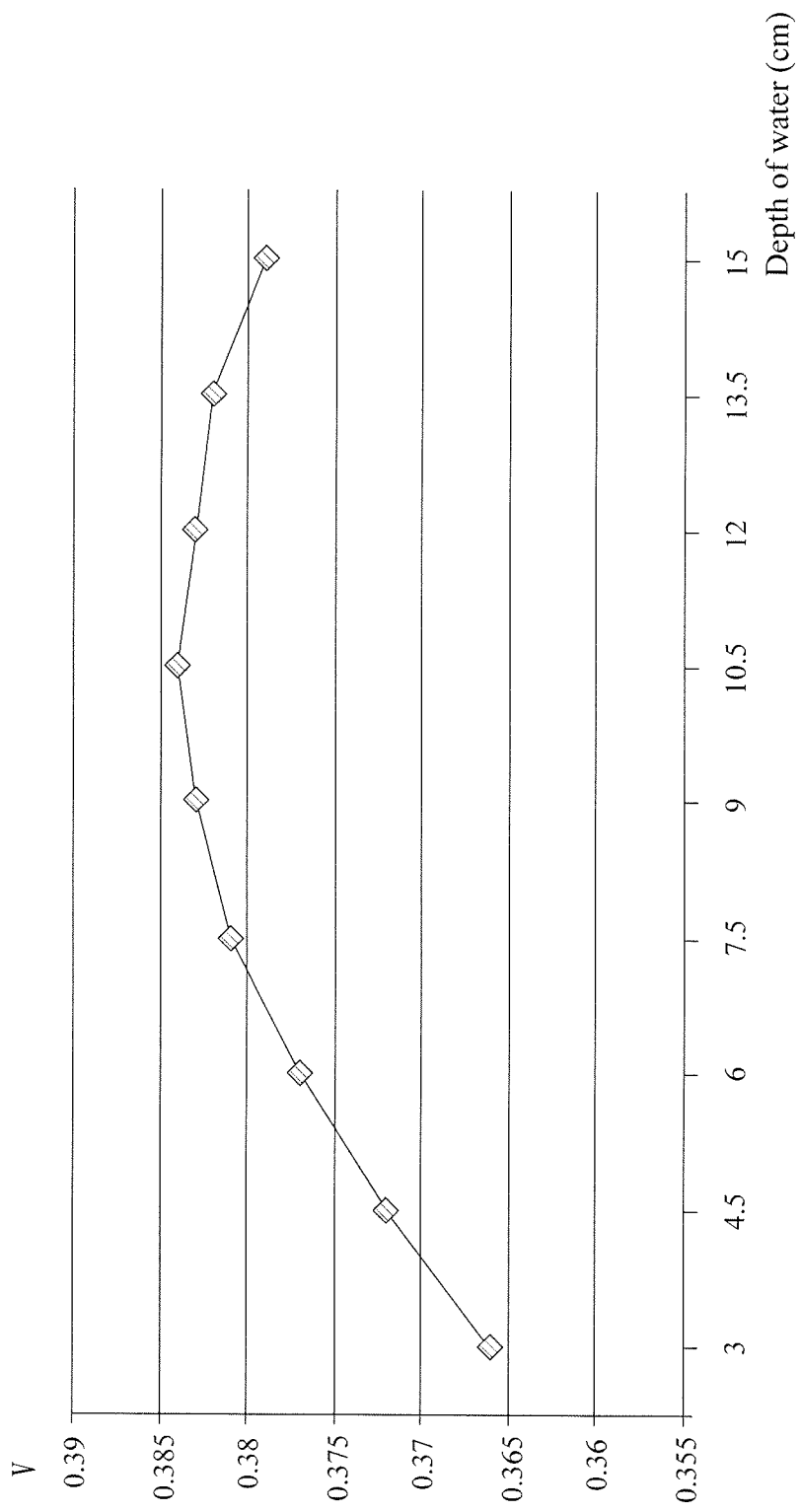
FIG. 20 is a diagram showing the output voltage of a solar cell with a 2000 c.c. beaker covered on and with various water depths (followed the schema of FIG. 5B).

We followed the schema in FIG. 5B, putted a 2000 c.c. beaker on a solar cell plate under an environment condition with 26° C., 1450±50 lux sunlight, and then adding water into the beaker, measuring the output voltage and showed the result in FIG. 20. The output voltage increased to 0.384 V and 0.379 V from 0.366 V while the water depth achieved 10.5 cm and 15 cm from 3 cm. this embodiment proved that the three-dimensional structure which appropriately combining liquid, solid and gas (e.g. air) could improve the power generation efficiency of the solar cell. This embodiment also proved that the power generation efficiency could be improved by the three-dimension structure that could increase the surface area to receiving light, and the refractive index of the water and glass combined structure is higher than environment substance (air).

Embodiment 14

We followed the schema in FIG. 1A, putted a solar cell into a 2000 c.c. beaker at 30° C. under 592 lux fluorescent light, added water 2-4 cm and measured the output voltage during water adding process. And then replaced the water with a Chinese ink and repeat the experiment, the transmittance of the Chinese ink is decreased in 0.994 times the transmittance of water. And then replaced the Chinese ink with a thicker Chinese ink and repeat the experiment, the transmittance of the thicker Chinese ink is decreased in 0.981 times the transmittance of water.

And then replaced the Chinese ink with another thicker Chinese ink and repeat the experiment, the transmittance of the thicker Chinese ink is decreased in 0.962 times the transmittance of water.

Figure 21:
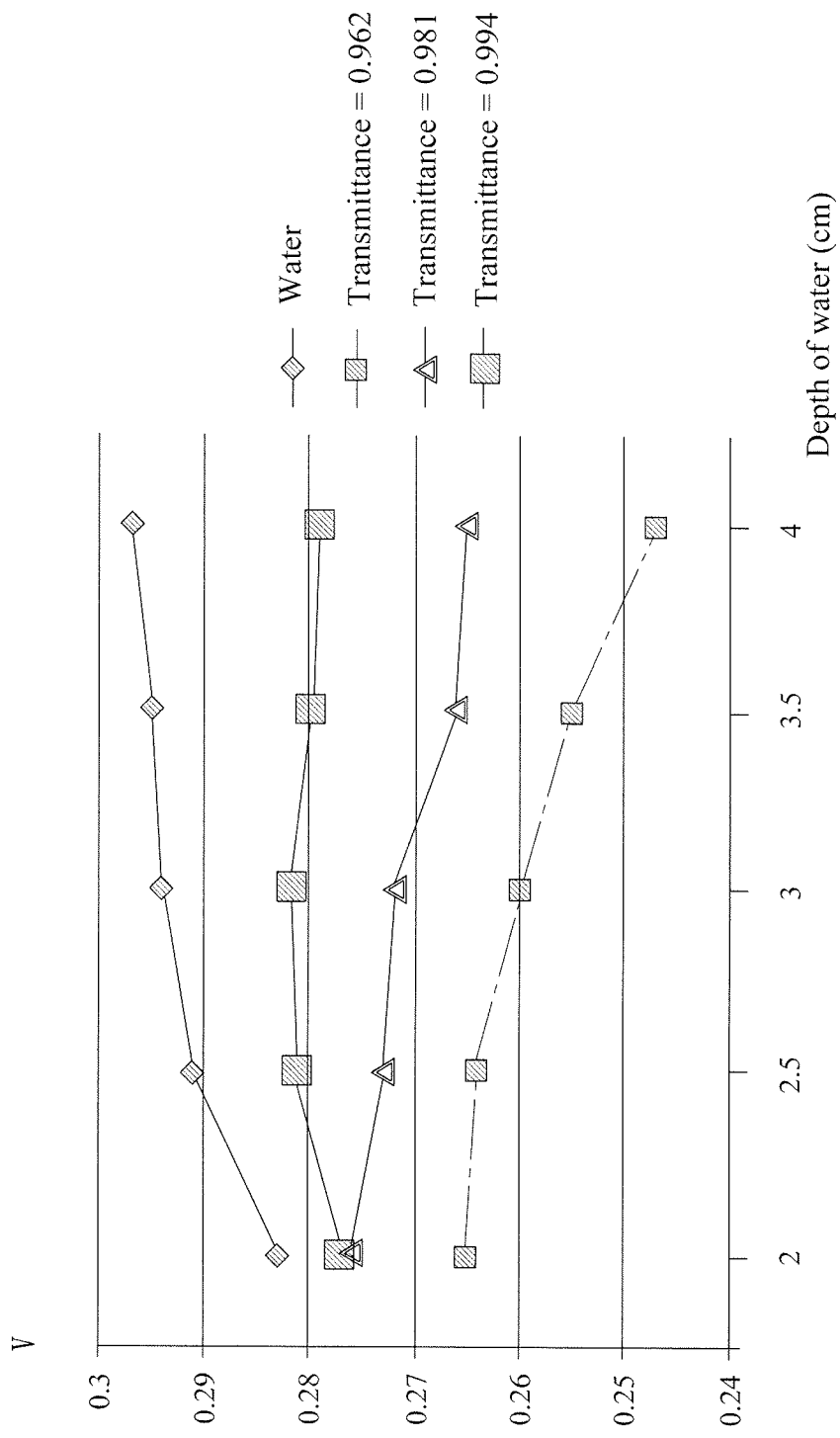
FIG. 21 is a diagram showing the output voltage of a solar cell cover with three-dimensional structures having water or ink with various transmittances and various heights. The transmittances of ink are 0.994, 0.981 and 0.962.

The result showed in FIG. 21, the figure showed the change of the output voltage of the solar cell with adding water or Chinese ink. The transmittances of Chinese inks are decreased to 0.994, 0.981 and 0.962 respectively.

According to the result, the output voltage increased by increasing the water depth (increasing the height of the three-dimensional structure, thus the introduced light increase). In the contract, if the transmittance of the liquid decreased, i.e. the absorptance of the three-dimensional structure increased, thus decreased the net light introducing amount. In this case, the output voltage of the solar cell decreased according to the depth of Chinese ink increased. In the Figure, while the transmittance=0.994, the output voltage slightly increased according to the depth of Chinese ink increased. While the transmittance=0.981 or less, the output voltage of the solar cell decreased with increasing depth. The result proved that increasing the surface area and refractive index of the three-dimensional structure could increase the introduced light of solar cell. The added three-dimensional structure must consider its light absorptance, only the three-dimensional structure with low light absorptance and high transmittance could increase the net light introduced amount, thereby increase the power generation efficiency of the solar cell.

Embodiment 15

Figure 22:
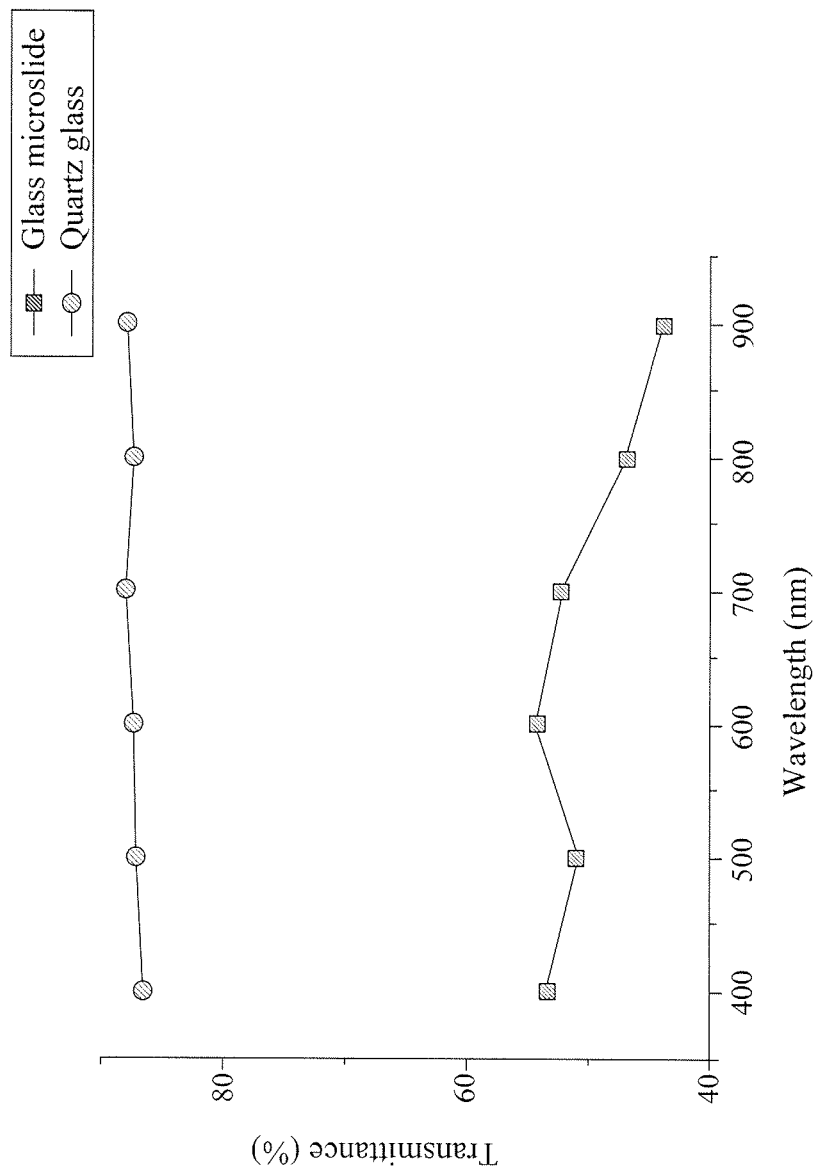
FIG. 22 is a diagram showing the transmittance of quartz glass and glass microslide various with wavelength.

Under 30° C. and 593 lux fluorescent light, the output voltage of a solar cell is 0.217 V. We followed the schema in FIG. 5A, putted a 6 mm height quartz glass plate (its transmittance showed in FIG. 22) on the solar cell, the output voltage increased to 0.221 V. Removing the 6 mm height quartz glass plate then putting 6 glass microslides on the solar cell, the total height of the 6 glass microslides is 6 mm and its transmittance showed in FIG. 22, then the output voltage decreased to 0.213 V. the result showed that putting the synergistic structure in the solar cell, the introduced light amount must greater than the absorbed light amount of the synergistic structure, i.e. produced net introduced light amount, could increase the power generation efficiency of the solar cell. This embodiment proved that added three-dimensional structure must consider its light absorptance, only the three-dimensional structure with low light absorptance and high transmittance and with increased surface area or higher mean refractive index (compare to environment substance, air) could increase the net light introduced amount, thereby increase the power generation efficiency of the solar cell. The 6 mm quartz glass could produce increased the net light introduced amount and increase the output voltage of the solar cell. In the contrast, the 6 mm glass microslides reduce the net light introduced amount because the higher light absorptance, thus reducing the output voltage of the solar cell.

Embodiment 16

Figure 23:
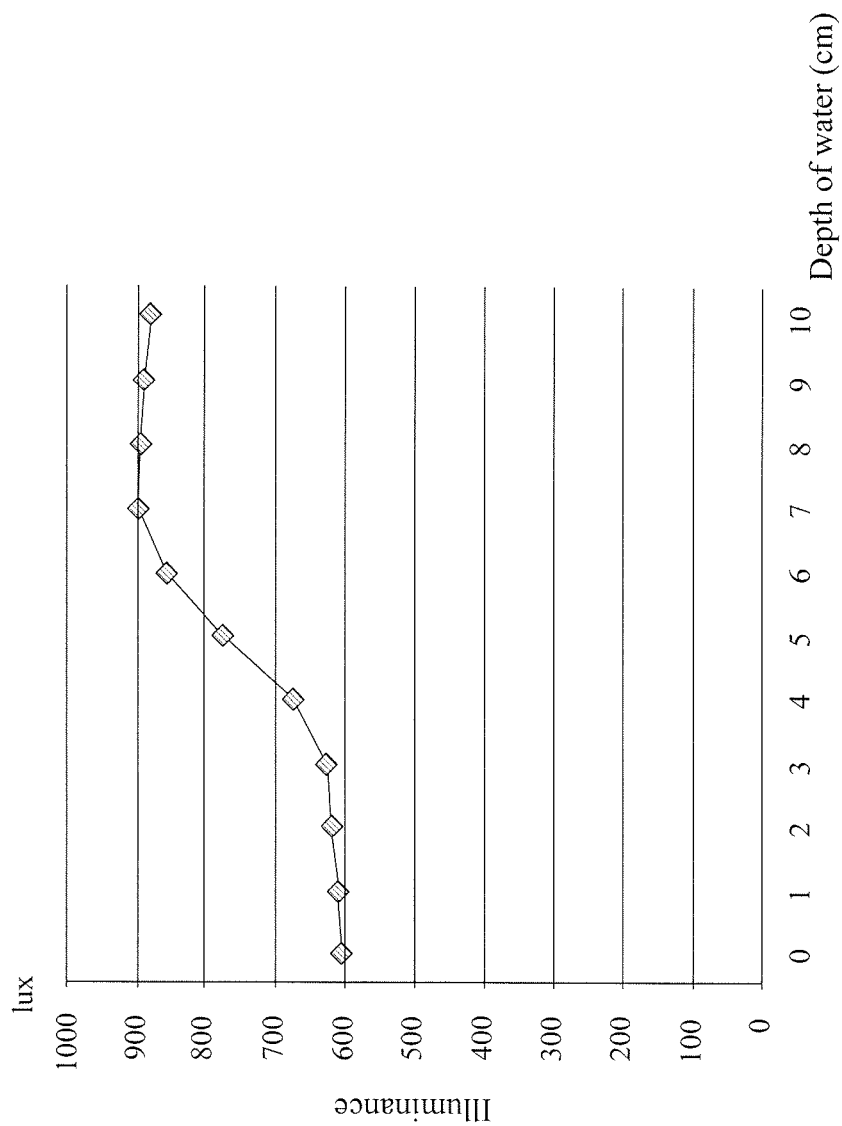
FIG. 23 is a diagram showing the illuminance changed with water depth, the illuminance measured by a sensor under a beaker.

Under 28° C., 630 lux fluorescent light condition, we followed the schema in FIG. 5B and putted an illuminance sensor under the beaker. Adding water from 0 cm to 10 cm depth and measuring the change of illuminance, the result showed in FIG. 23. In the figure, we found that increase surface area by adding water could increase the net light introduced amount (increase the illuminance received by the sensor). When the water depth achieve 9 cm or higher, the illuminance slightly decreased. This is because the effect of light absorption increases renders the net light introduced amount decreases. This embodiment proved that the three-dimensional structure could increase surface area for receiving light. This embodiment also proved that the three-dimensional structure constructed by the combination of water and glass (its refractive index is higher than the refractive index of air) could improve the power efficiency of the solar cell.

Embodiment 17

Figure 24:
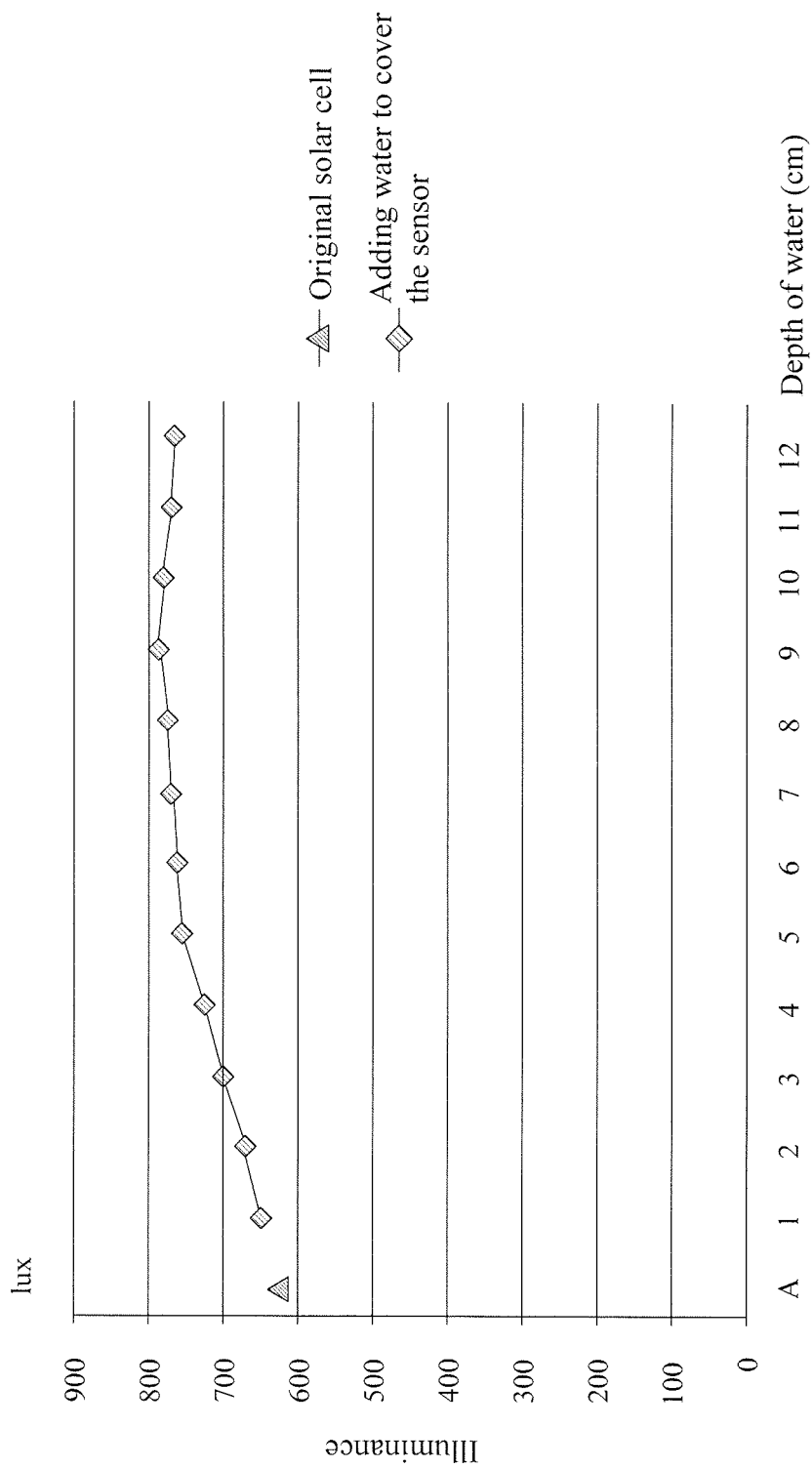
FIG. 24 is a diagram showing the illuminance changed with water depth, the illuminance measured by a sensor in a beaker.

Under 30° C., 630 lux fluorescent light condition, we followed the schema in FIG. 1A and putted an illuminance sensor packaged with a protective sleeve in the 2000 c.c. beaker, measured 622 lux illuminance. Adding water from 1 cm to 12 cm depth over the sensor and measuring the illuminance, the result showed in FIG. 24. There is no particular depth corresponds to the point A of the horizontal axis in FIG. 24, it is the illuminance with no water. In the figure, we found that adding water to increase water depth could increase the illuminance arrived to the sensor. The illuminance slightly decreased while the water depth is 10 cm and up, since the effect of light absorption increased and decreasing the illuminance arrived to the sensor. This embodiment proved that the three-dimensional structure constructed by the combination of water and glass (its refractive index is higher than the refractive index of air) could improve the power efficiency of the solar cell.

Embodiment 18

Figure 25:
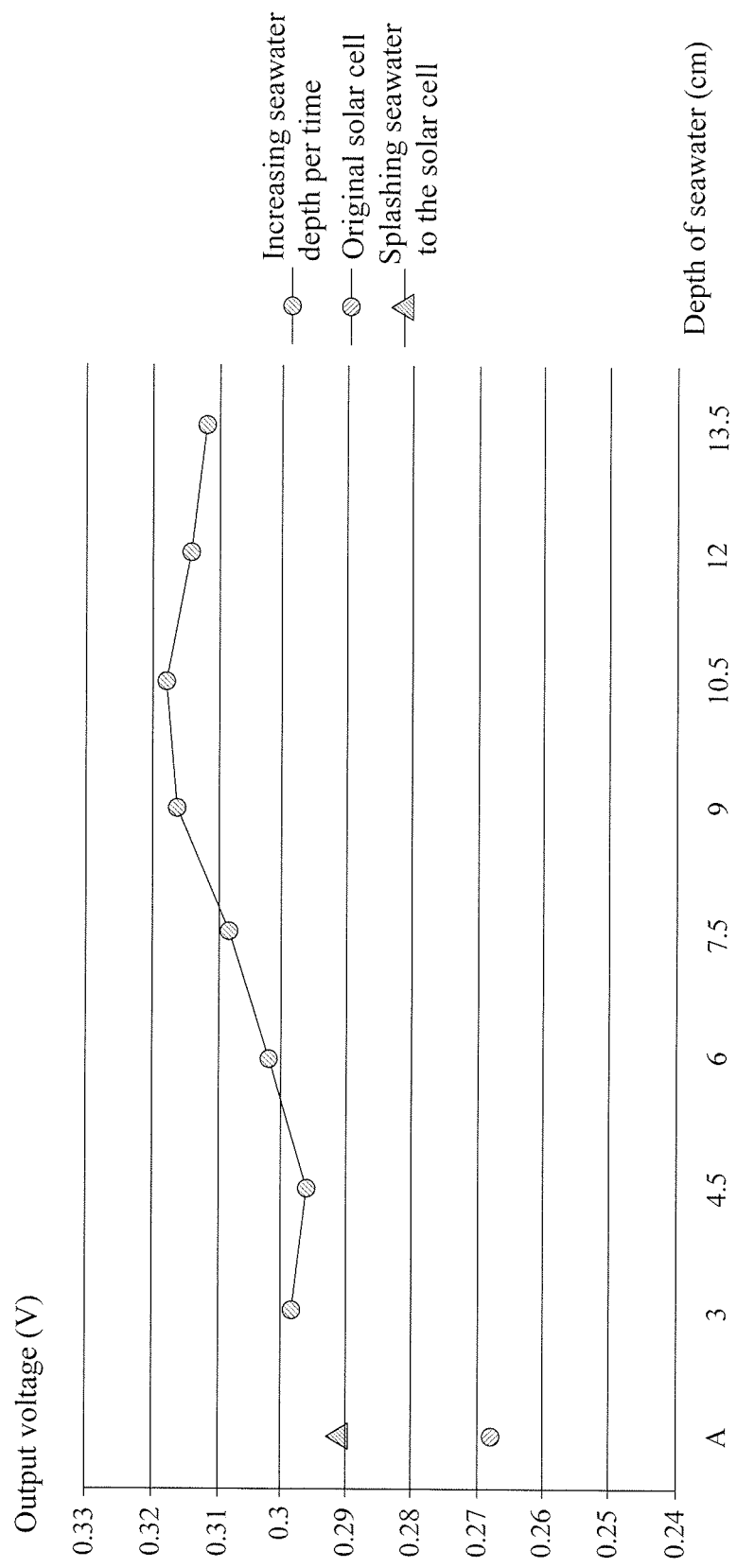
FIG. 25 is a diagram showing the output voltages of a solar cell in a 2000 c.c. beaker with various seawater depths under a fluorescent light condition.

Under 29° C., 626 lux fluorescent light condition, we followed the schema in FIG. 1A and putted a solar cell in the 2000 c.c. beaker, then measured the output voltage with/without seawater. The seawater is collected at marina. Measuring the output voltage while no seawater and adding seawater per time from 3 cm to 13.5 cm depth, the result showed in FIG. 25. There is no particular depth corresponds to the point A of the horizontal axis in FIG. 25, the conditions of the point described here or in FIG. 25.

The output voltage was 0.268 V while no seawater, and increased to 0.290 V after splashing seawater, then increased to 0.318 V while adding the seawater to 10.5 cm from 3 cm depth, and decreased to 0.312 V while adding the seawater to 13.5 cm from 10.5 cm depth. We found that the three-dimensional structure constructed by seawater and beaker also could improve the power generation efficiency of the solar cell. The three-dimensional structure (refractive index is higher than the refractive index of air) could increase the surface area for receiving light, reduce the surface temperature of the solar cell, thus improve the power efficiency of the solar cell.

Embodiment 19

Figure 26:
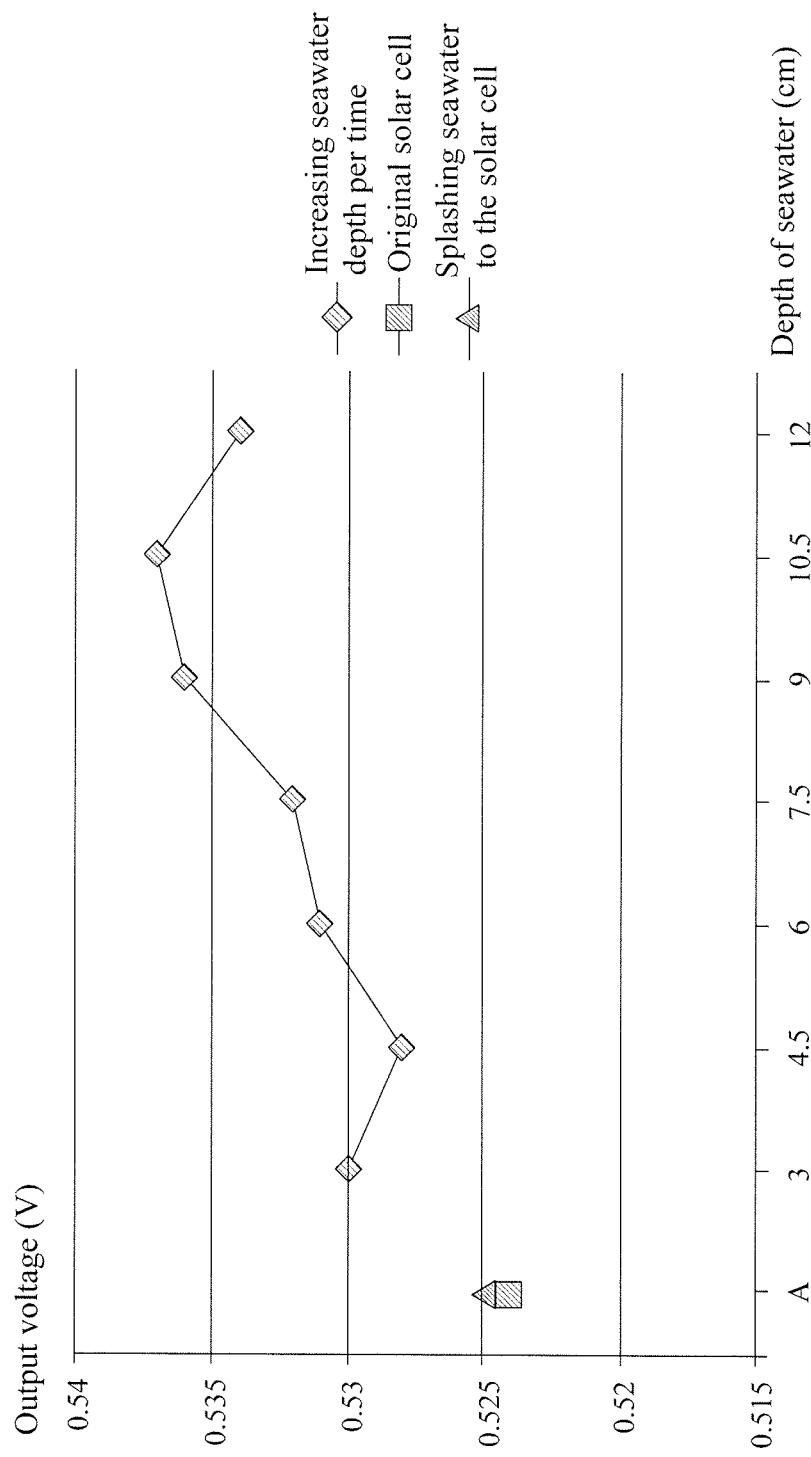
FIG. 26 is a diagram showing the output voltages of a solar cell in a 2000 c.c. beaker with various seawater depths under a sunlight condition.

We followed the schema in FIG. 1A, putted a solar cell to the 2000 c.c. beaker under 23000±500 lux sunlight condition, and collected the seawater from marina. Measuring the output voltage while no seawater and adding seawater per time to 12 cm depth from 3 cm, the result showed in FIG. 26. There is no particular depth corresponds to the point A of the horizontal axis in FIG. 26, the conditions of the point described here or in FIG. 26. The output voltage was 0.524 mV while no seawater, and increased to 0.525 mV after splashing seawater, then increased to 0.537 mV from 0.53 mV while adding the seawater to 10.5 cm from 3 cm depth, and decreased to 0.534 mV while adding the seawater to 12 cm depth. We found that the three-dimensional structure constructed by seawater and beaker also could improve the power generation efficiency of the solar cell. The three-dimensional structure (refractive index is higher than the refractive index of air) could increase the surface area for receiving light, reduce the surface temperature of the solar cell, thus improve the power efficiency of the solar cell. The result is consistency with the Embodiment 18, also proved that the three-dimensional structure constructed by seawater and beaker also could improve the power generation efficiency of the solar cell.

All of the embodiments above are measuring the output voltage to present the output of the solar cell, the output current also shows the same trend, we will describe below.

Embodiment 20

Figure 27A:
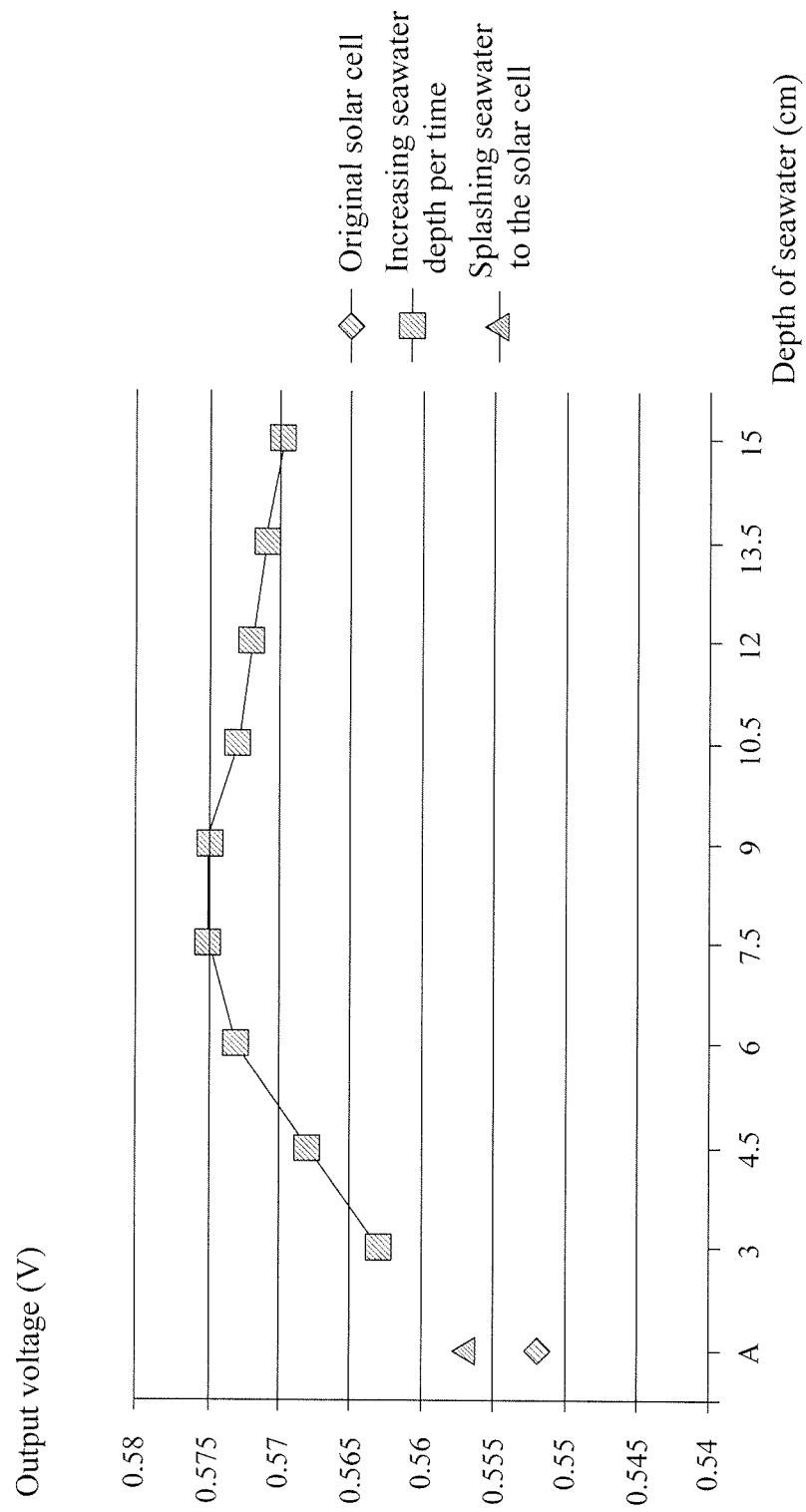
FIGS. 27A and 27B are diagrams showing the (A) output voltages or (B) output current of a solar cell in a 2000 c.c. beaker without water or with 3-15 cm water depths.
Figure 27B:
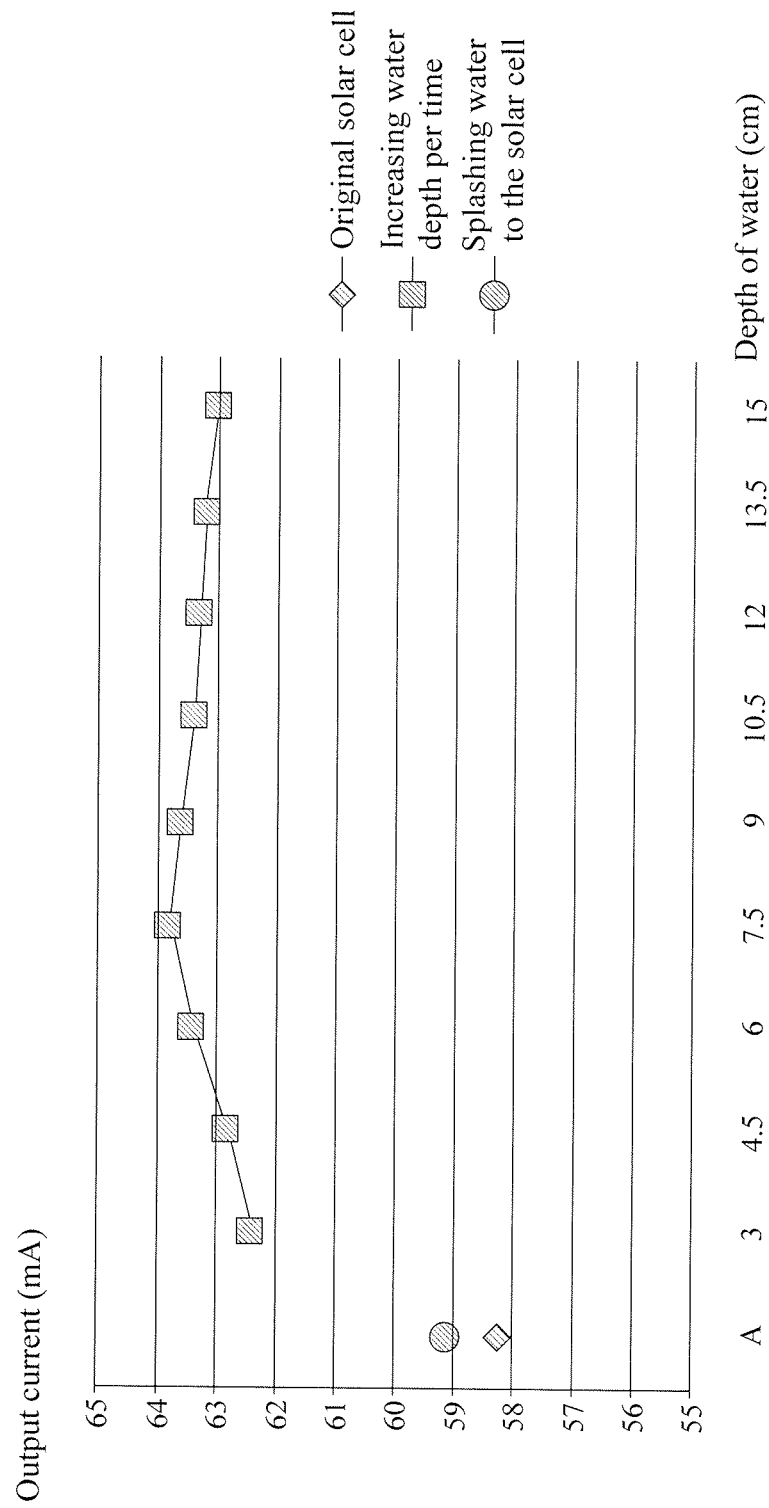

This embodiment proceeded as embodiment 1. We followed the schema in FIG. 1A and putted a solar cell in the 2000 c.c. beaker under 33° C., 85500±200 lux sunlight condition, then measured the output voltage with/without water. Then adding water per time until 15 cm from 3 cm depth, measuring the output voltage change and showed the result in FIG. 27A. There is no particular depth corresponds to the point A of the horizontal axis in FIG. 27A, there is the output voltage while with/without water. The output voltage was 0.552 mV while no water, and increased to 0.557 mV after splashing water, then increased to 0.575 mV and decreased to 0.570 mV from 0.563 mV while adding the seawater to 9 cm, 15 cm from 3 cm depth. The result is similar to the Embodiment 19. Then we putted a solar cell in the 2000 c.c. beaker under 33° C., 86800±300 lux sunlight condition, and then measured the output current with/without water. Then adding water per time until 15 cm from 3 cm depth, measuring the output current change and showed the result in FIG. 27B. There is no particular depth corresponds to the point A of the horizontal axis in FIG. 27B, there is the output current while with/without water. The output current was 58.3 mA while no water, and increased to 59.1 mA after splashing water, then increased to 63.8 mA and decreased to 63.0 mA from 62.4 mA while adding the seawater to 7.5 cm, 15 cm from 3 cm depth. The output current result showed consistency with the output voltage result.

According to the embodiments above, the embodiments 1-20 showed adding an appropriate synergistic structure on a solar cell could improve the power efficiency of the solar cell. The synergistic structure is a three-dimensional structure. The technique to improve power generation efficiency of a solar cell is the use of a principle of the surface area of the three-dimensional structure is larger than the surface area of the solar cell plate, thereby increasing light introduced into the solar cell and improving power generation efficiency of the solar cell. The embodiment 1, 3, 4 and 6-20 proved that the three-dimensional structure could be a structure formed by solid, liquid, gas or combination thereof, or could be formed by a combination of different substances. The structure formed by liquid, solid or combination thereof is easy to construct. It is preferred that choose high transmittance solid and high transmittance liquid to be the solid and liquid that use to form the three-dimensional structure. Further, using transparent substance to construct the three-dimensional structure is more preferred. The three-dimensional structure construct on a solar cell to improve power generation efficiency of the solar cell. In addition, the amount of light absorbed by three-dimensional structure affects the amount of light introduced in the solar cell. We need to overcome the amount of light absorbed by three-dimensional structure to increase the amount of light introduced in the solar cell and improve the power generation efficiency. In this case, constructing the synergistic structure on the solar cell could increase the net amount of light received by the solar cell, that is, the increased amount of light greater than absorbed amount of light could increase the power generation efficiency of the solar cell. The embodiment 7, 8, 10 and 14-20 proved that it is preferred that the substances which are used to construct three-dimensional structure have higher transmittance. Further, using transparent substance to construct the three-dimensional structure is more preferred. Increasing the front area and side area of the three-dimensional structure could increase the amount of introduced light and improve the power generation efficiency of the solar cell. Another technique of three-dimensional structure to improve the power generation efficiency of the solar cell is constructing the three-dimensional structure by high refractive index substances, renders the mean refractive index of the constructing substances is higher than the mean refractive index of environmental substance(s) around the solar cell (e.g. air) and the amount of introduced light per unit area thus increased, therefore improving the power generation efficiency of the solar cell. While the mean refractive index of the synergistic structure (i.e. the three-dimensional structure) is higher than the mean refractive index of environmental substance(s) around the solar cell, the numerical aperture of the solar cell became larger and the equivalent acceptance angle of the solar cell became larger, the Airy pattern is more centralized, thus increasing the amount of introduced light and improving the power generation efficiency of the solar cell. Among the substances that used to construct the three-dimensional structure, substances which have higher refractive index have better ability of improving power generation efficiency. It is effective when the mean refractive index of substances that used to construct the three-dimensional structure is higher than the mean refractive index of environmental substance(s) around the solar cell (generally is air), which can be proved by embodiment 5, 6, 10-20. Another technique of three-dimensional structure to improve the power generation efficiency of the solar cell is using glass, polymer, water (including seawater and freshwater), aqueous solution, organic compound (including hydrocarbons and carbohydrates) or combination thereof to construct the three-dimensional structure. By constructing the synergistic structure on the surface of the solar cell or immersing the solar cell in the liquid of the synergistic structure, we could reducing the temperature of the solar cell by thermal conduction, thermal radiation, thermal convection, flow (e.g. heat convection) or phase change (e.g. evaporation) caused by the substance (in particular liquids, e.g. water, aqueous solution and organic compounds) of synergistic structure to reduce the surface temperature of the solar cell and increase power generation efficiency of the solar cell. The liquid of synergistic structure (or three-dimensional structure) includes water (including seawater and freshwater), aqueous solution, organic compounds (e.g. alcohol and acetone) or combination thereof. The liquid of synergistic structure is effective to reduce the surface temperature of the solar cell and improve the power generation efficiency. Conventional solar cell plate used to construct dissipating device at its back side or around to dissipating heat. One feature of the present invention uses the front side of the solar cell or immersing the solar cell in liquid to dissipating heat. While the increased amount of power generation efficiency generated by dissipating heat is greater than decreased amount of power generation efficiency generated by absorbing light in the synergistic structure, producing the effect of increased power generation efficiency, proved in embodiment 1, 2, 10. Further, we could use the constructing substance of synergistic structure to improve power generation efficiency, the constructing substance includes water (including seawater and freshwater), aqueous solution, organic compounds (including hydrocarbons and carbohydrates) or combination thereof. By the contacting of the liquid and the solar cell, covering uniformly on the surface of the solar cell by the liquid (because of the connected pipes principle), diluting the unfavorable light-receiving impurities adsorbed on the surface of the solar cell, and employing the substances which its mean refractive index higher than the mean refractive index of environmental substance(s) around the solar cell (e.g. air), we could improving interface condition of the solar cell and increasing light introduced into the solar cell and improving the power generation efficiency, proved in embodiment 1, 3-6, 10 and 18-20.

Therefore, according to the features of the present invention, we can add a synergistic structure on a solar cell to improving the power generation efficiency of the solar cell.

What is claimed is:

1. A method for improving power generation efficiency of a solar cell, comprising: providing a synergistic structure for allowing the solar cell to receive light through thereof, wherein the synergistic structure is a three-dimensional structure; the three-dimensional structure has a surface area that is larger than a surface area of the solar cell to improve power generation efficiency of the solar cell by increasing light introduced into the solar cell, wherein the three-dimensional structure is a structure formed by liquid or a combination of solid, liquid and gas, wherein the liquid is alcohol having a height of 6-11.25 centimeters.

2. A method for improving power generation efficiency of a solar cell, comprising: providing a synergistic structure for allowing the solar cell to receive light through thereof, wherein the synergistic structure is a three-dimensional structure; the three-dimensional structure has a surface area that is larger than a surface area of the solar cell; and a refractive index of the three-dimensional structure is higher than a refractive index of environmental substances around the solar cell, wherein the three-dimensional structure is a structure formed by liquid or a combination of solid, liquid and gas, wherein the liquid is alcohol having a height of 6-11.25 centimeters.

3. A method for improving power generation efficiency of a solar cell, comprising:
   providing a synergistic structure for allowing the solar cell to receive light through thereof, wherein the synergistic structure is formed by liquid, wherein the synergistic structure has a surface area that is larger than a surface area of the solar cell to improve power generation efficiency of the solar cell by increasing light introduced into the solar cell;
   configuring the synergistic structure on a surface of the solar cell, or immersing the solar cell in the synergistic structure, wherein the liquid is alcohol having a height of 6-11.25 centimeters;
   reducing the temperature of the solar cell by the synergistic structure through thermal conduction, thermal radiation, thermal convection, flow or phase change to increase power generation efficiency of the solar cell.

4. A device for improving power generation efficiency of a solar cell, comprising:
   a synergistic structure configured on the solar cell for allowing the solar cell to receive light through thereof, wherein the synergistic structure is a three-dimensional structure, the three-dimensional structure has a surface area that is larger than a surface area of the solar cell, a refractive index of the synergistic structure is higher than a refractive index of environmental substances around the solar cell, wherein the three-dimensional structure is a structure formed by liquid or a combination of solid, liquid and gas, wherein the liquid is alcohol having a height of 6-11.25 centimeters.

* * * * *